United States Patent
Shiraki

(10) Patent No.: US 9,437,805 B2
(45) Date of Patent: Sep. 6, 2016

(54) PIEZOELECTRIC THIN FILM ELEMENT

(71) Applicant: MURATA MANUFACTURING CO., LTD., Nagaokakyo-Shi, Kyoto-fu (JP)

(72) Inventor: Hiroshi Shiraki, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 550 days.

(21) Appl. No.: 14/053,902

(22) Filed: Oct. 15, 2013

(65) Prior Publication Data

US 2014/0049138 A1 Feb. 20, 2014

Related U.S. Application Data

(63) Continuation of application No. PCT/JP2012/059561, filed on Apr. 6, 2012.

(30) Foreign Application Priority Data

Apr. 15, 2011 (JP) .................. 2011-090566
Dec. 2, 2011 (JP) .................. 2011-264342

(51) Int. Cl.
*H01L 41/18* (2006.01)
*H01L 41/16* (2006.01)
(Continued)

(52) U.S. Cl.
CPC .............. *H01L 41/16* (2013.01); *C04B 35/495* (2013.01); *C23C 18/1216* (2013.01);
(Continued)

(58) Field of Classification Search
CPC .......................... H01L 41/1873; H01L 41/16
USPC ....... 310/358; 252/62.9 R, 62.9 PZ; 501/134; 257/347
See application file for complete search history.

(56) References Cited

U.S. PATENT DOCUMENTS

2009/0121374 A1* 5/2009 Shibata ............... C04B 35/495
264/40.1
2009/0302715 A1* 12/2009 Shibata ............... H01L 41/1873
310/358
(Continued)

FOREIGN PATENT DOCUMENTS

EP 2065353 A1 * 6/2009 ............ C04B 35/14
JP 10-270771 9/1998
(Continued)

OTHER PUBLICATIONS

Kim et al. "Leakage Current Characteristics of Lead-Free KNaNbO Ferroelectric Thin Films with (K, Na) Excess and Li Substitution", Japanese Journal of Applied Physics 49 (2010).
(Continued)

*Primary Examiner* — J. San Martin
(74) *Attorney, Agent, or Firm* — Arent Fox LLP

(57) ABSTRACT

A piezoelectric thin film element that includes a substrate, a lower electrode on the substrate, a piezoelectric film on the lower electrode, and an upper electrode on the piezoelectric film. The piezoelectric film is a potassium sodium niobate film represented, as its main constituent, by the general formula $(1-n)(K_{1-x}Na_x)Nb_yO_3-nM1M2O_3$ in which M1 is any one of Ca, Sr, and Ba, and M2 is Zr, and x, y, and n respectively are within the ranges of: $0.25 \leq x \leq 1.00$; $0.85 \leq y \leq 1.10$; and $0.01 \leq n \leq 0.10$. Alternatively, M2 is any one of Sn and Hf, and x, y, and n respectively are within the ranges of: $0.25 \leq x \leq 1.00$; $0.90 \leq y \leq 1.05$; and $0.01 \leq n \leq 0.10$.

18 Claims, 3 Drawing Sheets

(51) Int. Cl.
   *C04B 35/495* (2006.01)
   *H01L 41/08* (2006.01)
   *H01L 41/187* (2006.01)
   *H01L 41/317* (2013.01)
   *C23C 18/12* (2006.01)

(52) U.S. Cl.
   CPC ...... *C23C 18/1225* (2013.01); *H01L 41/0805* (2013.01); *H01L 41/1873* (2013.01); *H01L 41/317* (2013.01); *C04B 2235/3201* (2013.01); *C04B 2235/3208* (2013.01); *C04B 2235/3213* (2013.01); *C04B 2235/3215* (2013.01); *C04B 2235/3248* (2013.01); *C04B 2235/3251* (2013.01); *C04B 2235/3293* (2013.01); *C04B 2235/6562* (2013.01); *C04B 2235/6567* (2013.01); *C04B 2235/79* (2013.01)

(56) References Cited

U.S. PATENT DOCUMENTS

| | | | | |
|---|---|---|---|---|
| 2011/0121690 | A1* | 5/2011 | Shibata | C04B 35/495 310/363 |
| 2013/0106242 | A1* | 5/2013 | Shibata | C04B 35/495 310/311 |
| 2014/0339458 | A1* | 11/2014 | Furukawa | H01L 41/1873 252/62.9 PZ |
| 2014/0339961 | A1* | 11/2014 | Maejima | H01L 41/0805 310/358 |
| 2015/0171311 | A1* | 6/2015 | Kubota | H01L 41/1871 252/62.9 PZ |
| 2015/0295160 | A1* | 10/2015 | Oshima | B32B 18/00 347/68 |
| 2015/0295161 | A1* | 10/2015 | Uebayashi | B32B 18/00 347/68 |
| 2015/0349239 | A1* | 12/2015 | Murakami | G02B 27/0006 428/402 |
| 2016/0052826 | A1* | 2/2016 | Yamazaki | G01L 23/222 310/311 |
| 2016/0122886 | A1* | 5/2016 | Wang | B01D 53/326 205/551 |

FOREIGN PATENT DOCUMENTS

| | | |
|---|---|---|
| JP | 2008-159807 A | 7/2008 |
| JP | 2009-049065 A | 3/2009 |
| JP | 2009-242166 A | 10/2009 |
| WO | WO-2005-021461 A1 | 3/2005 |

OTHER PUBLICATIONS

PCT/JP2012/059561 Written Opinion dated May 1, 2012.

* cited by examiner

PIEZOELECTRIC THIN FILM ELEMENT

CROSS REFERENCE TO RELATED APPLICATIONS

The present application is a continuation of International application No. PCT/JP2012/059561, filed Apr. 6, 2012, which claims priority to Japanese Patent Application No. 2011-090566, filed Apr. 6, 2011, and Japanese Patent Application No. 2011-264342, filed Dec. 2, 2011, the entire contents of each of which are incorporated herein by reference.

FIELD OF THE INVENTION

The present invention relates to a piezoelectric thin film element for use in an actuator, a sensor or the like.

BACKGROUND OF THE INVENTION

Piezoelectric bodies are now widely used as materials for functional electronic components such as actuators and sensors. As piezoelectric materials for use in these applications, perovskite-type ferroelectric materials are mainly used which are represented by the general formula $Pb(Zr,Ti)O_3$ referred to as PZT. However, the PZT, which contains harmful Pb (lead), is thus an unfavorable material for protecting the natural environment.

Therefore, various non-lead piezoelectric materials have been now actively researched and developed. One of the non-lead piezoelectric materials is a perovskite-type ferroelectric material represented by the general formula $(K,Na)NbO_3$, which is referred to as KNN. KNN (potassium sodium niobate) has been attracting massive attention because of having piezoelectric characteristics comparable to PZT.

For example, Patent Document 1 proposes a potassium sodium niobate thin film represented by $(K_{1-x}Na_x)NbO_3$ ($0 \leq x \leq 1$), which is created by a sputtering method. Further, Patent Document 1 discloses a high piezoelectric constant which can be achieved by creating a potassium sodium niobate (KNN) thin film with an average crystal grain size of from 0.1 μm to 1.0 μm and the crystal grains elongated in the substrate thickness direction.

In addition, Non-Patent Document 1 proposes a stoichiometric $K_{0.5}Na_{0.5}NbO_3$ thin film and a thin film of the composition with K and Na each 10 mol % excessively added thereto, which are created by a chemical solution deposition (CSD) method. Further, Non-Patent Document 1 discloses improvements in leakage current characteristics, which are observed by 10 mol % excessively adding each of K and Na.

Patent Document 1: Japanese Patent Application Laid-Open No. 2008-159807
Non-Patent Document 1: Japanese Journal of Applied Physics, Vol. 49, 2010, 095805

SUMMARY OF THE INVENTION

However, the conventional potassium sodium niobate thin films have a problem that while the leakage current is adequately low from $10^{-7}$ to $10^{-6}$ A/cm$^2$ in an applied electric field of 100 kV/cm, the leakage current is rapidly increased when the electric field exceeds 100 kV/cm, and is $10^{-2}$ A/cm$^2$ or more in an applied electric field of 200 kV/cm. Therefore, there has been no potassium sodium niobate thin film that is excellent in both leakage current characteristics and piezoelectric characteristics. For example, the thin film of the composition $(K_{1-x}Na_x)NbO_3$ ($0<x<1$) in Patent Document 1 has sintering-resistant potassium sodium niobate, and thus has unfavorable leakage current characteristics. Specifically, the leakage current is $10^{-1}$ A/cm$^2$ with the application of electric field of 200 kV/cm. Furthermore, although a ferroelectric hysteresis curve is determined, favorable ferroelectric characteristics have not been achieved.

Moreover, in the case of the potassium sodium niobate thin film of the composition with K and Na each 10 mol % excessively added thereto in Non-Patent Document 1, the leakage current is approximately $10^{-2}$ A/cm$^2$ in an applied electric field of 200 kV/cm.

Therefore, an object of the present invention is to provide a piezoelectric thin film element that has excellent electrical characteristics, in particular, excellent leakage current characteristics, ferroelectric characteristics, and piezoelectric characteristics.

An aspect of the invention is a piezoelectric thin film element including an electrode and a piezoelectric thin film, wherein the piezoelectric thin film is a potassium sodium niobate thin film represented by the general formula $(1-n)(K_{1-x}Na_x)Nb_yO_3-nBaZrO_3$, and the x, y, and n respectively fall within the ranges of: $0.25 \leq x \leq 0.75$; $0.85 \leq y \leq 1.10$; and $0.01 \leq n \leq 0.10$.

Further, an aspect of the invention is a piezoelectric thin film element including an electrode and a piezoelectric thin film, wherein the piezoelectric thin film is a potassium sodium niobate thin film represented by the general formula $(1-n)(K_{1-x}Na_x)Nb_yO_3-nBaSnO_3$, and the x, y, and n respectively fall within the ranges of: $0.25 \leq x \leq 0.75$; $0.90 \leq y \leq 1.05$; and $0.01 \leq n \leq 0.10$.

Further, an aspect of the invention is a piezoelectric thin film element including an electrode and a piezoelectric thin film, wherein the piezoelectric thin film is a potassium sodium niobate thin film represented by, as its main constituent, the general formula $(1-n)(K_{1-x}Na_x)Nb_yO_3-nM1M2O_3$ in which M1 is any one of Ca, Sr, and Ba, and M2 is Zr, and the x, y, and n respectively fall within the ranges of: $0.25 \leq x \leq 1.00$; $0.85 \leq y \leq 1.10$; and $0.01 \leq n \leq 0.10$.

Further, an aspect of the invention is a piezoelectric thin film element including an electrode and a piezoelectric thin film, wherein the piezoelectric thin film is a potassium sodium niobate thin film represented, as its main constituent, by the general formula $(1-n)(K_{1-x}Na_x)Nb_yO_3-nM1M2O_3$ in which M1 is any one of Ca, Sr, and Ba, and M2 is any one of Sn and Hf, and the x, y, and n respectively fall within the ranges of: $0.25 \leq x \leq 1.00$; $0.90 \leq y \leq 1.05$; and $0.01 \leq n \leq 0.10$.

In this case, the potassium sodium niobate and the M1M2O$_3$ (BaZrO$_3$, BaSnO$_3$, BaHfO$_3$, etc.) both have a perovskite structure. More specifically, K, Na, and M1 (Ca, Sr, Ba) are present at the same site (A site), whereas Nb and M2 (Zr, Sn, Hf) are present at the same site (B site). The potassium sodium niobate and the M1M2O$_3$ (BaZrO$_3$, BaSnO$_3$, BaHfO$_3$, etc.) are homogeneously dispersed in the piezoelectric thin film, but not to be considered limited to this homogeneous dispersion.

In addition, appropriate relationships among x, y, and n are shown in FIG. 1 as graphs. FIG. 1(A) is a graph showing the relationship between x and n, whereas FIG. 1(B) is a graph showing the relationship between x and y.

In the present invention, the rapid increase in leakage current is suppressed even when an electric field in excess of 100 kV/cm is applied to the piezoelectric thin film, because a potassium sodium niobate thin film with M1M2O$_3$ (BaZrO$_3$, BaSnO$_3$, BaHfO$_3$, etc.) as a solid solution is used as the piezoelectric thin film.

Further, in an aspect of the invention, the x, y, and n respectively fall within the ranges of: $0.80 \leq x \leq 1.00$; $0.85 \leq y \leq 1.10$; and $0.01 \leq n \leq 0.10$.

Further, in an aspect of the invention, the x, y, and n respectively fall within the ranges of: $0.80 \leq x \leq 1.00$; $0.90 \leq y \leq 1.05$; and $0.01 \leq n \leq 0.10$.

The hatched region in FIG. 1(A) is a region indicating the appropriate relationship between x and n when x, and n respectively fall within the ranges of: $0.80 \leq x \leq 1.00$ and $0.01 \leq n \leq 0.10$. The hatched region in FIG. 1(B) is a region indicating the appropriate relationship between x and y when x and y respectively fall within the ranges of: $0.80 \leq x \leq 1.00$ and $0.90 \leq y \leq 1.05$.

The present invention achieves a piezoelectric constant $d_{33}^*$ equal to or more than the numerical value of the piezoelectric constant $d_{33}^*$ of the potassium sodium niobate thin film with M1M2O$_3$ (BaZrO$_3$, BaSnO$_3$, BaHfO$_3$, etc.), which is not a solid solution.

According to the present invention, a piezoelectric thin film element is achieved which has excellent leakage current characteristics, ferroelectric characteristics, and piezoelectric characteristics.

The above-mentioned object, other objects, features, and advantages of this invention will be further evident from the following description with reference to the drawings.

BRIEF EXPLANATION OF THE DRAWINGS

FIG. 1(A) is a graph showing the relationship between x and n, whereas FIG. 1(B) is a graph showing the relationship between x and y.

DESCRIPTION OF REFERENCE SYMBOLS 12 substrate
14 lower electrode
16 potassium sodium niobate thin film
16a potassium sodium niobate layer
18 upper electrode

DETAILED DESCRIPTION OF THE INVENTION

Manufacture of Piezoelectric Thin Film Element According to First Embodiment

Figure 1:
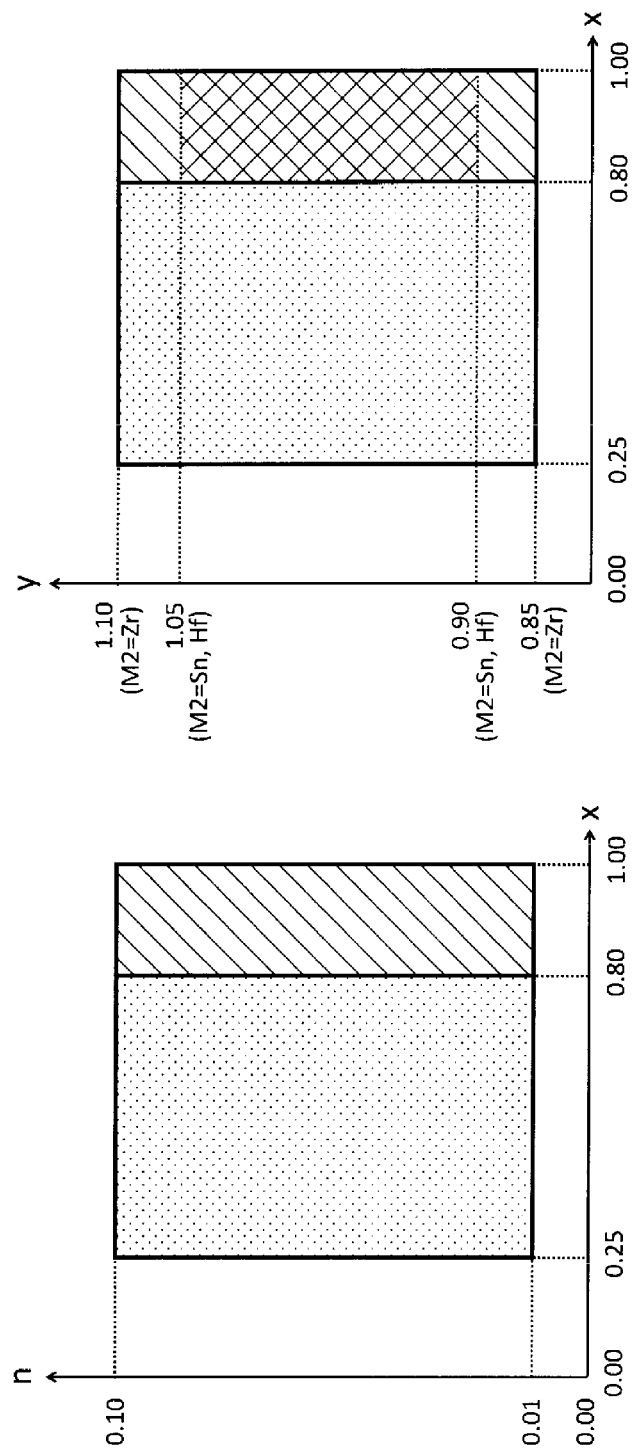
Figure 2:
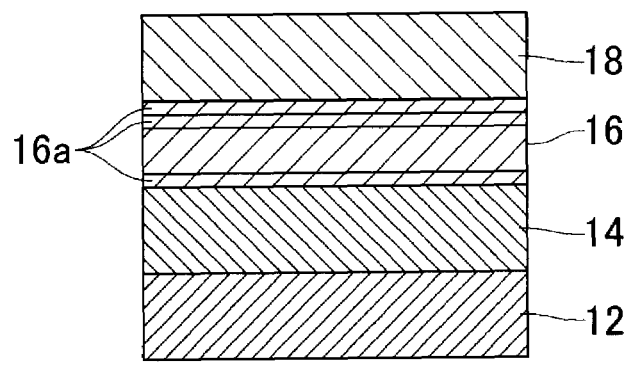
FIG. 2 is a cross-sectional view of a piezoelectric thin film element according to the present invention.

FIG. 2 is a cross-sectional view schematically illustrating the configuration of a piezoelectric thin film element according to a first embodiment. The piezoelectric thin film element includes a substrate 12, a lower electrode 14 formed on the substrate 12, a piezoelectric thin film 16 formed on the lower electrode 14, and an upper electrode 18 formed on the piezoelectric thin film 16.

It is to be noted that the content of BaZrO$_3$ in a potassium sodium niobate thin film represented by the general formula $(1-n)(K_{1-x}Na_x)Nb_yO_3$-nBaZrO$_3$ as the piezoelectric thin film 16 is varied in the first embodiment.

For example, a silicon substrate (Si substrate) is used for the substrate 12. Further, for the substrate 12, substrates may be used such as a glass substrate, a quartz glass substrate, a GaAs substrate, a GaN substrate, a CaF$_2$ substrate, a sapphire substrate, an MgO substrate, an SrTiO$_3$ substrate, an LaAlO$_3$ substrate, a stainless-steel substrate.

The piezoelectric thin film 16, that is, potassium sodium niobate (KNN) thin film 16 is created by using a chemical solution deposition method.

First, potassium ethoxide, sodium ethoxide, pentaethoxy niobium, manganese acetylacetonato, barium ethoxide, and tetraisopropoxy zirconium as raw materials are prepared to meet $0.52 \times (1-n)$: $0.72 \times (1-n)$: $0.95 \times (1-n)$: $0.02 \times (1-n)$:n:n in terms of molar ratio. In the case of the present first embodiment herein, seven types of 0.00, 0.005, 0.01, 0.03, 0.05, 0.1, and 0.12 are selected as n.

Next, the potassium ethoxide, sodium ethoxide, pentaethoxy niobium, manganese acetylacetonato, barium ethoxide, and tetraisopropoxy zirconium as raw materials are mixed into a 2-methoxyethanol solvent in a glove box.

Next, the mixed solution is refluxed at 125° C. for 16 hours in a nitrogen atmosphere to provide a potassium sodium niobate (KNN) precursor solution (also referred to as a solution for chemical solution deposition) that has a concentration of 0.3 M.

On the other hand, the lower electrode 14 is formed on the Si substrate 12 by a magnetron DC sputtering method. Pt or the like is used as a material for the lower electrode 14.

The sputtering conditions include the sputtering output: 100 W; the sputtering time: 5 minutes; the temperature of the substrate 12: 300° C.; and the degree of vacuum: 5 millitorr.

Next, the potassium sodium niobate precursor solution is applied by spin coating onto the lower electrode 14 in a dry gas.

Next, a first heat treatment (preparatory heat treatment or drying treatment) is carried out. More specifically, the potassium sodium niobate precursor solution applied onto the lower electrode 14 is heated up at a rate of temperature increase of 120° C./min with the use of a hot plate heated in advance to a temperature of 350° C., and dried at 350° C. for 3 minutes.

Next, a second heat treatment (main heat treatment or firing treatment) is carried out. More specifically, the dried potassium sodium niobate precursor film is heated up at a rate of temperature increase of 5° C./min or less in the temperature range of 350° C. to 750° C. (including temperatures around 500° C., which rapidly decompose complexes formed by reflux), and subjected to firing for 10 minutes at a temperature of 750° C. Thus, the potassium sodium niobate layer 16a is formed. The potassium sodium niobate layer 16a formed by the single process described previously is 30 nm in thickness.

Furthermore, the process for forming the potassium sodium niobate layer 16a is repeated 10 times to form a potassium sodium niobate thin film 16 that has a composition of $(1-n)(K_{0.45}Na_{0.55})Nb_{0.95}O_3$-nBaZrO$_3$ with a film thickness of 300 nm.

Next, the upper electrode 18 is formed by a magnetron DC sputtering method onto the potassium sodium niobate thin film 16. Pt or the like is used as a material for the upper electrode 18.

The sputtering conditions include the sputtering output: 100 W; the sputtering time: 5 minutes; the temperature of the substrate 12: 150° C.; and the degree of vacuum: 5 millitorr.

Thus, a piezoelectric thin film element is obtained.

It has been confirmed by composition analysis with Inductively Coupled Plasma (ICP) that the composition of the potassium sodium niobate thin film 16 is bang on target.

Evaluation of Piezoelectric Thin Film Element According to First Embodiment

Table 1 shows electrical characteristics of the piezoelectric thin film element in the case of varying the proportion n of $BaZrO_3$ from 0.00 (sample No. 1), through 0.005 (sample No. 2), 0.01 (sample No. 3), 0.03 (sample No. 4), and 0.10 (sample No. 5), to 0.12 (sample No. 6). Items for the electrical characteristics are insulation properties, dielectric constant $\in$, tan δ, and ferroelectric characteristics.

For the insulation properties, leakage current values in an electric field of 200 kV/cm were measured with the use of a measurement device "Electrometer 6517" (trade name from Keithley Instruments Inc.). For the dielectric constant $\in$ and tan δ, the values at 1 kHz in the case of applying no voltage were measured with the use of a measurement device "HP4284A" (trade name from Agilent Technologies). For the ferroelectric characteristics, the values of saturation polarization Ps in hysteresis curves measured at a measuring frequency of 10 kHz and an applied voltage of 500 kV/cm were measured with the use of a measurement device "Precision Premier II" (trade name from Radiant Technologies, Inc). In the case of the leakage current of $5.43×10^{-5}$ $A/cm^2$ or less and the saturation polarization Ps of 10 $μC/cm^2$ or more, the sample was determined as a non-defective product (G), whereas the sample was determined as a defective product (NG) in all other cases. The leakage current of $5.43×10^{-5}$ $A/cm^2$ is one digit smaller than the leakage current of $5.43×10^{-4}$ $A/cm^2$ of the sample (sample No. 1) containing no $BaZrO_3$.

TABLE 1

| Sample No. | n | Leakage Current ($A/cm^2$) @200 kV/cm | $\in$ @1 kHz | tanδ (%) @1 kHz | $p_s$ ($μC/cm^2$) | G/NG Determination |
|---|---|---|---|---|---|---|
| 1* | 0.00 | $5.43 × 10^{-4}$ | 726 | 2.12 | 28 | NG |
| 2* | 0.005 | $5.62 × 10^{-5}$ | 729 | 1.97 | 24 | NG |
| 3 | 0.01 | $5.09 × 10^{-6}$ | 753 | 1.96 | 20 | G |
| 4 | 0.03 | $3.15 × 10^{-6}$ | 844 | 1.85 | 18 | G |
| 5 | 0.10 | $2.77 × 10^{-6}$ | 1075 | 1.73 | 11 | G |
| 6* | 0.12 | $2.26 × 10^{-6}$ | 587 | 1.62 | 7 | NG |

Mark *: outside the scope of the present invention

The sample No. 1 (n=0.00, containing no $BaZrO_3$) and the sample No. 2 (n=0.005) were determined as defective products (NG) because of the leakage currents of $5.43×10^{-5}$ $A/cm^2$ or more. The sample No. 6 (n=0.12) was determined as a defective product (NG) because of the saturation polarization Ps less than 10 $μC/cm^2$. On the other hand, the sample No. 3 (n=0.01), sample No. 4 (n=0.03), and sample No. 5 (n=0.10) were determined as non-defective products (G) because of the leakage currents of $5.43×10^{-5}$ $A/cm^2$ or less and the saturation polarization Ps of 10 $μC/cm^2$ or more.

More specifically, in the case of sample No. 2, the leakage current of $5.62×10^{-5}$ $A/cm^2$ is rarely different from $5.43×10^{-4}$ $A/cm^2$ as the leakage current of sample No. 1 (containing no $BaZrO_3$). However, the sample No. 3, the sample No. 4, the sample No. 5, and the sample No. 6, which are respectively $5.09×10^{-6}$ $A/cm^2$, $3.15×10^{-6}$ $A/cm^2$, $2.77×10^{-6}$ $A/cm^2$, and $2.26×10^{-6}$ $A/cm^2$ in leakage current, have achieved favorable leakage current characteristics.

Furthermore, the sample Nos. 1 to 6, which are respectively 28 $μC/cm^2$, 24 $μC/cm^2$, 20 $μC/cm^2$, 18 $μC/cm^2$, 11 $μC/cm^2$, and 7 $μC/cm^2$ in saturation polarization Ps, have a tendency to decrease the saturation polarization Ps as n is increased (in other words, the proportion of $BaZrO_3$ is increased). Further, the sample No. 6 (n=0.12) has substantially decreased saturation polarization Ps less than 10 $μC/cm^2$.

From the foregoing description, it is determined that the potassium sodium niobate thin film 16 with $BaZrO_3$ as a solid solution in the range of $0.01 \le n \le 0.10$ with respect to $(K_{0.45}Na_{0.55})Nb_{0.95}O_3$ can improve the leakage current characteristics while maintaining excellent ferroelectric characteristics.

Moreover, the sample Nos. 3, 4, and 5 determined as non-defective products (G), and the sample No. 1 containing no $BaZrO_3$ for comparison were selected to measure the changes in electrostatic capacitance with temperature. The measurement results are shown in Table 2. The measurement was made with the use of a cryostat in the temperature range of −55° C. to 85° C. in terms of actual use temperature. The rate of change of electrostatic capacitance was figured out from the formula (1) with the use of the measured electrostatic capacitance. It is to be noted that $C_{20}$ is an electrostatic capacitance value at 20° C., and $C_T$ is an electrostatic capacitance value at a temperature T.

$$\text{Rate of Change of Electrostatic Capacitance} = \{(C_T - C_{20})/C_{20}\} \times 100 \quad (1)$$

TABLE 2

| Sample No. | n | Rate of Change of Electrostatic Capacitance (−55 to +85° C.) | $d_{33}*$ (pm/V) |
|---|---|---|---|
| 1* | 0.00 | 30% | 124.0 |
| 3 | 0.01 | 19% (Characteristics B) | 117.0 |
| 4 | 0.03 | 13% (Characteristics B) | 124.7 |
| 5 | 0.10 | 3% (Characteristics B) | 120.0 |

Mark *outside the scope of the present invention

Next, the electric-field induced strain Z was measured for the sample Nos. 1, 3, 4, and 5 with the use of a scanning probe microscope "SPA 400" (trade name from SII Nano-Technology Inc.). The $Z_{max}/V_{max}$ was figured out from the measured maximum applied voltage $V_{max}$ and the maximum electric-field induced strain $Z_{max}$ at the voltage. This value of $Z_{max}/V_{max}$ is regarded as a piezoelectric constant $d_{33}*$. Further, the maximum applied voltage $V_{max}$ is 25 V, and the measuring frequency ranges from 0.5 to 10 Hz. The average value for the values obtained is regarded as the piezoelectric constant $d_{33}*$ of the sample. The measurement results are shown in Table 2 above.

The sample No. 1 (n=0.00, containing no $BaZrO_3$) outside the scope of the present invention exhibited an extremely high rate of 30% as the rate of change of electrostatic capacitance.

On the other hand, the sample No. 3 (n=0.01), sample No. 4 (n=0.03), and sample No. 5 (n=0.10) within the scope of the present invention respectively exhibited 19%, 13%, and 3% as the rate of change of electrostatic capacitance. More specifically, the rates of change of electrostatic capacitance for the sample Nos. 3 to 5 meet the characteristics B, and are decreased as the proportion n of $BaZrO_3$ is increased. This contrasts with the fact that the rate of change of dielectric constant (electrostatic capacitance) increases as the proportion of $BaZrO_3$ is increased in the case of a bulk material of $(1-x) (K_{0.5}Na_{0.5}) NbO_3-xBaZrO_3$.

On the other hand, the piezoelectric constants $d_{33}*$ of the sample Nos. 3 to 5 are respectively 117.0 pm/V, 124.7 pm/V, and 120.0 pm/V, which are values comparable to 124.0 pm/V of the sample No. 1 (containing no $BaZrO_3$).

In the present first embodiment, the evaluations were made on the samples containing 2 mol of Mn with respect to 100 mol of $(K_{0.45}Na_{0.55})Nb_{0.95}O_3$. However, evaluation results similar to those in the first embodiment were achieved on samples containing 10 mol of Mn or less with respect to 100 mol of the main constituent (1-n) $(K_{0.45}Na_{0.55})Nb_{0.95}O_3$-$nBaZrO_3$.

Manufacture of Piezoelectric Thin Film Element According to Second Embodiment

A piezoelectric thin film element according to a second embodiment is configured in the same fashion as the piezoelectric thin film element shown in FIG. 2 according to the first embodiment.

It is to be noted that the x and y in a potassium sodium niobate thin film represented by the general formula (1-n) $(K_{1-x}Na_x)Nb_yO_3$-$nBaZrO_3$ as the piezoelectric thin film 16 are varied in the second embodiment.

The piezoelectric thin film 16, that is, potassium sodium niobate (KNN) thin film 16 is created by using a chemical solution deposition method.

First, potassium ethoxide, sodium ethoxide, pentaethoxy niobium, manganese acetylacetonato, barium ethoxide (or calcium ethoxide or strontium ethoxide), and tetraisopropoxy zirconium as raw materials are prepared to meet $(1.07-x)\times 0.97:(x+0.17)\times 0.97:y\times 0.97:0.02\times 0.97:0.03:0.03$ in terms of molar ratio. In the case of the present second embodiment herein, x and y respectively satisfy a conditional expression $0.2 \leq x \leq 1.00$ and a conditional expression $0.8 \leq y \leq 1.15$.

Thereafter, a piezoelectric thin film element including a substrate 12, a lower electrode 14 formed on the substrate 12, a piezoelectric thin film 16 formed on the lower electrode 14, and an upper electrode 18 formed on the piezoelectric thin film 16 is created by the same method as in the first embodiment.

The piezoelectric thin film 16 is a potassium sodium niobate (KNN) thin film that has a composition of $0.97(K_{1-x}Na_x)Nb_yO_3$-$0.03M1ZrO_3$ ($0.2 \leq x \leq 1.00$, $0.8 \leq y \leq 1.15$, M1=Ca, Sr, Ba) with a film thickness of 300 nm.

Evaluation of Piezoelectric Thin Film Element According to Second Embodiment

Tables 3, 4, 5, and 6 show: the leakage current in an electric field of 200 kV/cm; the dielectric constant $\in$ and tan $\delta$ at a frequency of 1 kHz; and the value of saturation polarization Ps measured at a measuring frequency of 10 kHz and an applied electric field of 500 kV/cm, in the case of varying the x and y in $0.97 (K_{1-x}Na_x)Nb_yO_3$-$0.03BaZrO_3$ in the ranges of $0.2 \leq x \leq 1.00$ and $0.8 \leq y \leq 1.15$ (sample No. 4, sample Nos. 7 to 141). It is to be noted that, in the same manner as in the first embodiment, in the case of the leakage current of $5.43 \leq x \leq 10^{-5}$ A/cm$^2$ or less and the saturation polarization Ps of 10 μC/cm$^2$ or more, the sample was determined as a non-defective product (G), whereas the sample was determined as a defective product (NG) in all other cases.

TABLE 3

| Sample No. | x | y | Leakage Current (A/cm$^2$) @200 kV/cm | $\in$ @1 kHz | tan$\delta$ (%) @1 kHz | $P_s$ (μC/cm$^2$) | G/NG Determination |
|---|---|---|---|---|---|---|---|
| 7* | 0.20 | 0.80 | $2.70 \times 10^{-3}$ | Unmeasurable | Unmeasurable | Unmeasurable | NG |
| 8* | 0.25 | 0.80 | $6.09 \times 10^{-3}$ | Unmeasurable | Unmeasurable | Unmeasurable | NG |
| 9* | 0.30 | 0.80 | $1.64 \times 10^{-3}$ | Unmeasurable | Unmeasurable | Unmeasurable | NG |
| 10* | 0.35 | 0.80 | $4.59 \times 10^{-4}$ | Unmeasurable | Unmeasurable | Unmeasurable | NG |
| 11* | 0.40 | 0.80 | $1.12 \times 10^{-1}$ | Unmeasurable | Unmeasurable | Unmeasurable | NG |
| 12* | 0.45 | 0.80 | $3.60 \times 10^{-3}$ | Unmeasurable | Unmeasurable | Unmeasurable | NG |
| 13* | 0.50 | 0.80 | $3.13 \times 10^{-3}$ | 888 | 1.87 | 14 | NG |
| 14* | 0.55 | 0.80 | $1.40 \times 10^{-3}$ | 844 | 2.03 | 12 | NG |
| 15* | 0.60 | 0.80 | $1.20 \times 10^{-2}$ | 849 | 1.82 | 13 | NG |
| 16* | 0.65 | 0.80 | $2.57 \times 10^{-4}$ | Unmeasurable | Unmeasurable | Unmeasurable | NG |
| 17* | 0.70 | 0.80 | $1.30 \times 10^{-2}$ | 1020 | 2.49 | 20 | NG |
| 18* | 0.75 | 0.80 | $1.02 \times 10^{-3}$ | 1010 | 2.01 | 22 | NG |
| 19* | 0.80 | 0.80 | $3.26 \times 10^{-4}$ | 955 | 1.88 | 23 | NG |
| 20* | 0.85 | 0.80 | $5.34 \times 10^{-4}$ | 991 | 2.31 | 22 | NG |
| 21* | 0.90 | 0.80 | $2.18 \times 10^{-4}$ | 983 | 2.55 | 21 | NG |
| 22* | 0.95 | 0.80 | $1.99 \times 10^{-4}$ | 1003 | 2.08 | 22 | NG |
| 23* | 1.00 | 0.80 | $4.13 \times 10^{-4}$ | 970 | 2.66 | 20 | NG |
| 24* | 0.20 | 0.85 | $9.38 \times 10^{-5}$ | 1103 | 2.24 | 20 | NG |
| 25 | 0.25 | 0.85 | $2.04 \times 10^{-8}$ | 1050 | 2.17 | 19 | G |
| 26 | 0.30 | 0.85 | $7.39 \times 10^{-8}$ | 979 | 2.27 | 18 | G |
| 27 | 0.35 | 0.85 | $9.31 \times 10^{-8}$ | 945 | 2.95 | 16 | G |
| 28 | 0.40 | 0.85 | $8.63 \times 10^{-8}$ | 888 | 2.88 | 17 | G |
| 29 | 0.45 | 0.85 | $7.06 \times 10^{-8}$ | 902 | 2.58 | 18 | G |
| 30 | 0.50 | 0.85 | $7.16 \times 10^{-8}$ | 1050 | 2.48 | 20 | G |
| 31 | 0.55 | 0.85 | $9.92 \times 10^{-8}$ | 979 | 2.78 | 23 | G |
| 32 | 0.60 | 0.85 | $1.13 \times 10^{-7}$ | 912 | 1.96 | 23 | G |
| 33 | 0.65 | 0.85 | $9.12 \times 10^{-8}$ | 1150 | 2.24 | 20 | G |
| 34 | 0.70 | 0.85 | $8.55 \times 10^{-8}$ | 1210 | 2.18 | 25 | G |
| 35 | 0.75 | 0.85 | $1.07 \times 10^{-7}$ | 1230 | 2.23 | 22 | G |
| 36 | 0.80 | 0.85 | $9.01 \times 10^{-8}$ | 998 | 2.07 | 22 | G |

TABLE 3-continued

| Sample No. | x | y | Leakage Current (A/cm²) @200 kV/cm | ε @1 kHz | tanδ (%) @1 kHz | $P_s$ (μC/cm²) | G/NG Determination |
|---|---|---|---|---|---|---|---|
| 37 | 0.85 | 0.85 | $7.97 \times 10^{-8}$ | 1021 | 1.98 | 21 | G |
| 38 | 0.90 | 0.85 | $8.69 \times 10^{-8}$ | 1150 | 1.88 | 22 | G |
| 39 | 0.95 | 0.85 | $9.21 \times 10^{-8}$ | 1008 | 2.03 | 22 | G |
| 40 | 1.00 | 0.85 | $9.88 \times 10^{-8}$ | 992 | 2.11 | 21 | G |

Mark *: outside the scope of the present invention

TABLE 4

| Sample No. | x | y | Leakage Current (A/cm²) @200 kV/cm | ε @1 kHz | tanδ (%) @1 kHz | $P_s$ (μC/cm²) | G/NG Determination |
|---|---|---|---|---|---|---|---|
| 41* | 0.20 | 0.90 | $9.17 \times 10^{-5}$ | 1340 | 2.80 | 22 | NG |
| 42 | 0.25 | 0.90 | $1.15 \times 10^{-7}$ | 1200 | 2.62 | 20 | G |
| 43 | 0.30 | 0.90 | $1.17 \times 10^{-7}$ | 1180 | 3.06 | 21 | G |
| 44 | 0.35 | 0.90 | $1.22 \times 10^{-7}$ | 1040 | 2.55 | 20 | G |
| 45 | 0.40 | 0.90 | $1.17 \times 10^{-7}$ | 1050 | 3.13 | 23 | G |
| 46 | 0.45 | 0.90 | $2.33 \times 10^{-7}$ | 963 | 3.04 | 27 | G |
| 47 | 0.50 | 0.90 | $2.69 \times 10^{-7}$ | 940 | 2.43 | 27 | G |
| 48 | 0.55 | 0.90 | $1.05 \times 10^{-7}$ | 936 | 2.87 | 27 | G |
| 49 | 0.60 | 0.90 | $1.15 \times 10^{-7}$ | 984 | 3.04 | 27 | G |
| 50 | 0.65 | 0.90 | $1.28 \times 10^{-7}$ | 859 | 2.56 | 26 | G |
| 51 | 0.70 | 0.90 | $1.73 \times 10^{-7}$ | 945 | 2.45 | 26 | G |
| 52 | 0.75 | 0.90 | $1.94 \times 10^{-7}$ | 753 | 2.35 | 23 | G |
| 53 | 0.80 | 0.90 | $2.05 \times 10^{-7}$ | 657 | 2.16 | 23 | G |
| 54 | 0.85 | 0.90 | $1.90 \times 10^{-7}$ | 864 | 2.55 | 28 | G |
| 55 | 0.90 | 0.90 | $2.34 \times 10^{-7}$ | 986 | 2.36 | 26 | G |
| 56 | 0.95 | 0.90 | $1.97 \times 10^{-7}$ | 1125 | 2.28 | 27 | G |
| 57 | 1.00 | 0.90 | $2.53 \times 10^{-7}$ | 1189 | 2.10 | 28 | G |
| 58* | 0.20 | 0.95 | $9.18 \times 10^{-5}$ | 830 | 2.00 | 19 | NG |
| 59 | 0.25 | 0.95 | $2.90 \times 10^{-6}$ | 883 | 2.10 | 22 | G |
| 60 | 0.30 | 0.95 | $9.68 \times 10^{-6}$ | 859 | 1.80 | 22 | G |
| 61 | 0.35 | 0.95 | $5.89 \times 10^{-6}$ | 936 | 1.92 | 22 | G |
| 62 | 0.40 | 0.95 | $5.10 \times 10^{-6}$ | 844 | 1.88 | 20 | G |
| 63 | 0.45 | 0.95 | $6.38 \times 10^{-6}$ | 984 | 2.57 | 19 | G |
| 64 | 0.50 | 0.95 | $1.82 \times 10^{-6}$ | 998 | 2.46 | 19 | G |
| 4 | 0.55 | 0.95 | $3.15 \times 10^{-6}$ | 844 | 1.85 | 18 | G |
| 65 | 0.60 | 0.95 | $2.75 \times 10^{-6}$ | 964 | 2.11 | 20 | G |
| 66 | 0.65 | 0.95 | $3.04 \times 10^{-6}$ | 926 | 2.11 | 22 | G |
| 67 | 0.70 | 0.95 | $1.19 \times 10^{-6}$ | 868 | 1.70 | 20 | G |
| 68 | 0.75 | 0.95 | $1.28 \times 10^{-5}$ | 873 | 1.71 | 20 | G |
| 69 | 0.80 | 0.95 | $2.05 \times 10^{-6}$ | 796 | 1.83 | 20 | G |
| 70 | 0.85 | 0.95 | $3.21 \times 10^{-6}$ | 856 | 1.93 | 20 | G |
| 71 | 0.90 | 0.95 | $5.55 \times 10^{-6}$ | 880 | 1.88 | 22 | G |
| 72 | 0.95 | 0.95 | $8.32 \times 10^{-6}$ | 923 | 2.03 | 21 | G |
| 73 | 1.00 | 0.95 | $4.33 \times 10^{-6}$ | 957 | 2.15 | 21 | G |

Mark *: outside the scope of the present invention

TABLE 5

| Sample No. | x | y | Leakage Current (A/cm²) @200 kV/cm | ε @1 kHz | tanδ (%) @1 kHz | $P_s$ (μC/cm²) | G/NG Determination |
|---|---|---|---|---|---|---|---|
| 74* | 0.20 | 1.00 | $6.37 \times 10^{-3}$ | 883 | 2.22 | 18 | NG |
| 75 | 0.25 | 1.00 | $6.89 \times 10^{-5}$ | 883 | 1.98 | 19 | G |
| 76 | 0.30 | 1.00 | $5.94 \times 10^{-6}$ | 907 | 2.27 | 22 | G |
| 77 | 0.35 | 1.00 | $7.20 \times 10^{-6}$ | 916 | 2.22 | 22 | G |
| 78 | 0.40 | 1.00 | $1.19 \times 10^{-6}$ | 998 | 2.82 | 22 | G |
| 79 | 0.45 | 1.00 | $2.86 \times 10^{-6}$ | 892 | 2.54 | 20 | G |
| 80 | 0.50 | 1.00 | $2.06 \times 10^{-6}$ | 1010 | 2.94 | 23 | G |
| 81 | 0.55 | 1.00 | $3.41 \times 10^{-6}$ | 912 | 2.41 | 19 | G |
| 82 | 0.60 | 1.00 | $8.51 \times 10^{-6}$ | 777 | 2.36 | 18 | G |
| 83 | 0.65 | 1.00 | $7.73 \times 10^{-6}$ | 849 | 3.03 | 21 | G |
| 84 | 0.70 | 1.00 | $4.87 \times 10^{-6}$ | 710 | 2.06 | 16 | G |
| 85 | 0.75 | 1.00 | $4.60 \times 10^{-5}$ | 729 | 1.82 | 20 | G |
| 86 | 0.80 | 1.00 | $2.23 \times 10^{-6}$ | 710 | 1.63 | 19 | G |
| 87 | 0.85 | 1.00 | $4.42 \times 10^{-6}$ | 830 | 1.88 | 20 | G |

TABLE 5-continued

| Sample No. | x | y | Leakage Current (A/cm$^2$) @200 kV/cm | $\epsilon$ @1 kHz | tan$\delta$ (%) @1 kHz | $P_s$ ($\mu$C/cm$^2$) | G/NG Determination |
|---|---|---|---|---|---|---|---|
| 88 | 0.90 | 1.00 | 3.38 × 10$^{-6}$ | 842 | 1.90 | 19 | G |
| 89 | 0.95 | 1.00 | 5.19 × 10$^{-6}$ | 866 | 1.00 | 21 | G |
| 90 | 1.00 | 1.00 | 6.22 × 10$^{-6}$ | 903 | 1.79 | 24 | G |
| 91* | 0.20 | 1.05 | 4.49 × 10$^{-2}$ | 902 | 2.13 | 21 | NG |
| 92 | 0.25 | 1.05 | 1.30 × 10$^{-5}$ | 926 | 2.79 | 21 | G |
| 93 | 0.30 | 1.05 | 1.12 × 10$^{-6}$ | 859 | 2.51 | 22 | G |
| 94 | 0.35 | 1.05 | 9.91 × 10$^{-6}$ | 844 | 2.15 | 21 | G |
| 95 | 0.40 | 1.05 | 7.95 × 10$^{-6}$ | 907 | 2.27 | 21 | G |
| 96 | 0.45 | 1.05 | 1.07 × 10$^{-6}$ | 792 | 2.31 | 19 | G |
| 97 | 0.50 | 1.05 | 2.68 × 10$^{-6}$ | 744 | 2.14 | 20 | G |
| 98 | 0.55 | 1.05 | 3.65 × 10$^{-6}$ | 758 | 1.74 | 20 | G |
| 99 | 0.60 | 1.05 | 2.41 × 10$^{-6}$ | 614 | 2.30 | 18 | G |
| 100 | 0.65 | 1.05 | 1.63 × 10$^{-6}$ | 653 | 1.86 | 17 | G |
| 101 | 0.70 | 1.05 | 5.65 × 10$^{-6}$ | 715 | 1.66 | 18 | G |
| 102 | 0.75 | 1.05 | 5.19 × 10$^{-5}$ | 725 | 1.81 | 18 | G |
| 103 | 0.80 | 1.05 | 5.28 × 10$^{-6}$ | 677 | 1.73 | 20 | G |
| 104 | 0.85 | 1.05 | 4.86 × 10$^{-6}$ | 709 | 2.00 | 20 | G |
| 105 | 0.90 | 1.05 | 4.69 × 10$^{-6}$ | 755 | 2.16 | 21 | G |
| 106 | 0.95 | 1.05 | 5.22 × 10$^{-6}$ | 743 | 1.98 | 23 | G |
| 107 | 1.00 | 1.05 | 8.01 × 10$^{-6}$ | 800 | 1.90 | 23 | G |

Mark *: outside the scope of the present invention

TABLE 6

| Sample No. | x | y | Leakage Current (A/cm$^2$) @200 kV/cm | $\epsilon$ @1 kHz | tan$\delta$ (%) @1 kHz | $P_s$ ($\mu$C/cm$^2$) | G/NG Determination |
|---|---|---|---|---|---|---|---|
| 108* | 0.20 | 1.10 | 8.86 × 10$^{-4}$ | 777 | 2.79 | 20 | NG |
| 109 | 0.25 | 1.10 | 1.04 × 10$^{-5}$ | 701 | 2.44 | 18 | G |
| 110 | 0.30 | 1.10 | 8.21 × 10$^{-6}$ | 657 | 3.00 | 18 | G |
| 111 | 0.35 | 1.10 | 9.54 × 10$^{-6}$ | 723 | 2.15 | 19 | G |
| 112 | 0.40 | 1.10 | 2.18 × 10$^{-6}$ | 725 | 2.47 | 18 | G |
| 113 | 0.45 | 1.10 | 8.32 × 10$^{-6}$ | 653 | 2.56 | 18 | G |
| 114 | 0.50 | 1.10 | 3.20 × 10$^{-6}$ | 629 | 2.62 | 17 | G |
| 115 | 0.55 | 1.10 | 8.60 × 10$^{-6}$ | 600 | 2.10 | 15 | G |
| 116 | 0.60 | 1.10 | 7.54 × 10$^{-6}$ | 590 | 2.63 | 15 | G |
| 117 | 0.65 | 1.10 | 9.86 × 10$^{-6}$ | 585 | 2.51 | 15 | G |
| 118 | 0.70 | 1.10 | 7.69 × 10$^{-6}$ | 657 | 1.89 | 16 | G |
| 119 | 0.75 | 1.10 | 3.20 × 10$^{-5}$ | 638 | 2.03 | 15 | G |
| 120 | 0.80 | 1.10 | 9.28 × 10$^{-6}$ | 590 | 2.09 | 16 | G |
| 121 | 0.85 | 1.10 | 8.87 × 10$^{-6}$ | 663 | 1.99 | 17 | G |
| 122 | 0.90 | 1.10 | 7.77 × 10$^{-6}$ | 670 | 1.86 | 18 | G |
| 123 | 0.95 | 1.10 | 7.69 × 10$^{-6}$ | 621 | 2.12 | 20 | G |
| 124 | 1.00 | 1.10 | 8.19 × 10$^{-6}$ | 608 | 2.09 | 21 | G |
| 125* | 0.20 | 1.15 | 4.26 × 10$^{-4}$ | 602 | 2.54 | 17 | NG |
| 126* | 0.25 | 1.15 | 9.24 × 10$^{-5}$ | 586 | 1.98 | 18 | NG |
| 127* | 0.30 | 1.15 | 8.21 × 10$^{-5}$ | 572 | 3.22 | 16 | NG |
| 128* | 0.35 | 1.15 | 1.54 × 10$^{-4}$ | 523 | 3.10 | 15 | NG |
| 129* | 0.40 | 1.15 | 8.18 × 10$^{-5}$ | 538 | 2.85 | 17 | NG |
| 130* | 0.45 | 1.15 | 2.32 × 10$^{-4}$ | 510 | 2.46 | 17 | NG |
| 131* | 0.50 | 1.15 | 3.20 × 10$^{-4}$ | 498 | 2.19 | 19 | NG |
| 132* | 0.55 | 1.15 | 8.60 × 10$^{-4}$ | 476 | 2.77 | 20 | NG |
| 133* | 0.60 | 1.15 | 6.65 × 10$^{-4}$ | 460 | 1.99 | 18 | NG |
| 134* | 0.65 | 1.15 | 2.16 × 10$^{-4}$ | 458 | 4.01 | 16 | NG |
| 135* | 0.70 | 1.15 | 5.90 × 10$^{-4}$ | 431 | 3.02 | 18 | NG |
| 136* | 0.75 | 1.15 | 3.20 × 10$^{-3}$ | 425 | 3.11 | 17 | NG |
| 137* | 0.80 | 1.15 | 3.33 × 10$^{-4}$ | 410 | 3.86 | 17 | NG |
| 138* | 0.85 | 1.15 | 3.28 × 10$^{-4}$ | 420 | 3.56 | 18 | NG |
| 139* | 0.90 | 1.15 | 2.88 × 10$^{-4}$ | 435 | 3.44 | 19 | NG |
| 140* | 0.95 | 1.15 | 6.98 × 10$^{-4}$ | 412 | 3.21 | 20 | NG |
| 141* | 1.00 | 1.15 | 5.18 × 10$^{-4}$ | 466 | 3.06 | 20 | NG |

Mark *: outside the scope of the present invention

The sample Nos. 7 to 23 in Table 3 refer to samples in the case of varying x in the range of 0.20≤x≤1.00 with y=0.80. These samples are high in leakage current from 1.99×10$^{-4}$ A/cm$^2$ to 1.12×10$^{-1}$ A/cm$^2$, from which the effect of BaZrO$_3$ in a solid solution is not observed. Accordingly, the sample Nos. 7 to 23 were determined as defective products (NG). This is because the molar ratio between (K$_{1-x}$, Na$_x$, Ba) at the site A and (Nb$_y$, Zr) at the site B significantly deviates from the stoichiometric composition.

The sample Nos. 24 to 40 refer to samples in the case of varying x in the range of 0.20≤x≤1.00 with y=0.85. Among the samples, the leakage current of the sample with x=0.20

(sample No. 24) is $9.38 \times 10^{-5}$ A/cm². The sample was determined as a defective product (NG) because the value was little different from that of the sample No. 1 containing no $BaZrO_3$.

On the other hand, the leakage currents of the samples with $0.25 \leq x \leq 1.00$ (the sample Nos. 25 to 40) range from $2.04 \times 10^{-8}$ A/cm² to $1.13 \times 10^{-7}$ A/cm². These values show significant improvements in leakage current as compared with the sample No. 1 containing no $BaZrO_3$. Furthermore, the saturation polarization Ps ranges from 16 to 25 µC/cm², and the ferroelectric characteristics were thus also maintained. Accordingly, the samples with $0.25 \leq x \leq 1.00$ (the sample Nos. 25 to 40) were determined as non-defective products (G).

The sample Nos. 41 to 57 in Table 4 refer to samples in the case of varying x in the range of $0.20 \leq x \leq 1.00$ with y=0.90. Among the samples, the leakage current of the sample with x=0.20 (sample No. 41) is $9.17 \times 10^{-5}$ A/cm². The sample was determined as a defective product (NG) because the value was little different from that of the sample No. 1 containing no $BaZrO_3$.

On the other hand, the leakage currents of the samples with $0.25 \leq x \leq 1.00$ (the sample Nos. 42 to 57) range from $1.05 \times 10^{-7}$ A/cm² to $2.69 \times 10^{-7}$ A/cm². These values show significant improvements in leakage current as compared with the sample No. 1 containing no $BaZrO_3$. Furthermore, the saturation polarization Ps ranges from 20 to 27 µC/cm², and the ferroelectric characteristics were thus also maintained. Accordingly, the samples with $0.25 \leq x \leq 1.00$ (the sample Nos. 42 to 57) were determined as non-defective products (G).

The sample No. 4 and Nos. 58 to 73 in Table 4 refer to samples in the case of varying x in the range of $0.20 \leq x \leq 1.00$ with y=0.95. Among the samples, the leakage current of the sample with x=0.20 (sample No. 58) is $9.18 \times 10^{-5}$ A/cm². The sample was determined as a defective product (NG) because the value was little different from or worse than that of the sample No. 1 containing no $BaZrO_3$.

On the other hand, the leakage currents of the samples with $0.25 \leq x \leq 1.00$ (the sample No. 4 and sample Nos. 59 to 73) range from $1.19 \times 10^{-6}$ A/cm² to $9.68 \times 10^{-6}$ A/cm². These values show significant improvements in leakage current as compared with the sample No. 1 containing no $BaZrO_3$. Furthermore, the saturation polarization Ps ranges from 18 to 22 µC/cm², and the ferroelectric characteristics were thus also maintained. Accordingly, the samples with $0.25 \leq x \leq 1.00$ (the sample No. 4 and sample Nos. 59 to 73) were determined as non-defective products (G).

The sample Nos. 74 to 90 in Table 5 refer to samples in the case of varying x in the range of $0.20 \leq x \leq 1.00$ with y=1.00. Among the samples, the leakage current of the sample with x=0.20 (sample No. 74) is $6.37 \times 10^{-3}$ A/cm². The sample was determined as a defective product (NG) because the value was little different from that of the sample No. 1 containing no $BaZrO_3$.

On the other hand, the leakage currents of the samples with $0.25 \leq x \leq 1.00$ (the sample Nos. 75 to 90) range from $1.19 \times 10^{-6}$ A/cm² to $8.51 \times 10^{-6}$ A/cm². These values show significant improvements in leakage current as compared with the sample No. 1 containing no $BaZrO_3$. Furthermore, the saturation polarization Ps ranges from 16 to 24 µC/cm², and the ferroelectric characteristics were thus also maintained. Accordingly, the samples with $0.25 \leq x \leq 1.00$ (the sample Nos. 75 to 90) were determined as non-defective products (G).

The sample Nos. 91 to 107 in Table 5 refer to samples in the case of varying x in the range of $0.20 \leq x \leq 1.00$ with y=1.05. Among the samples, the leakage current of the sample with x=0.20 (sample No. 91) is $4.49 \times 10^{-2}$ A/cm². The sample was determined as a defective product (NG) because the value was worse than that of the sample No. 1 containing no $BaZrO_3$.

On the other hand, the leakage currents of the samples with $0.25 \leq x \leq 1.00$ (the sample Nos. 92 to 107) range from $1.07 \times 10^{-6}$ A/cm² to $5.19 \times 10^{-5}$ A/cm². These values show significant improvements in leakage current as compared with the sample No. 1 containing no $BaZrO_3$. Furthermore, the saturation polarization Ps ranges from 17 to 23 µC/cm², and the ferroelectric characteristics were thus also maintained. Accordingly, the samples with $0.25 \leq x \leq 1.00$ (the sample Nos. 92 to 107) were determined as non-defective products (G).

The sample Nos. 108 to 124 in Table 6 refer to samples in the case of varying x in the range of $0.20 \leq x \leq 1.00$ with y=1.10. Among the samples, the leakage current of the sample with x=0.20 (sample No. 108) is $8.86 \times 10^{-4}$ A/cm². The sample was determined as a defective product (NG) because the value was little different from or worse than that of the sample No. 1 containing no $BaZrO_3$.

On the other hand, the leakage currents of the samples with $0.25 \leq x \leq 1.00$ (the sample Nos. 109 to 124) range from $2.18 \times 10^{-6}$ A/cm² to $3.20 \times 10^{-5}$ A/cm². These values show significant improvements in leakage current as compared with the sample No. 1 containing no $BaZrO_3$. Furthermore, the saturation polarization Ps ranges from 15 to 21 µC/cm², and the ferroelectric characteristics were thus also maintained. Accordingly, the samples with $0.25 \leq x \leq 1.00$ (the sample Nos. 109 to 124) were determined as non-defective products (G).

The sample Nos. 125 to 141 refer to samples in the case of varying x in the range of $0.20 \leq x \leq 1.00$ with y=1.15. These samples are high in leakage current from $8.18 \times 10^{-5}$ A/cm² to $1.76 \times 10^{-1}$ A/cm², from which the effect of $BaZrO_3$ in a solid solution is not observed. Accordingly, the sample Nos. 125 to 141 were determined as defective products (NG). This is because the molar ratio between ($K_{1-x}$, $Na_x$, Ba) at the site A and ($Nb_y$, Zr) at the site B significantly deviates from the stoichiometric composition.

In addition, the samples determined as non-defective products (G) are all 3% or less in tan δ, which is extremely low. Therefore, it is determined that high-quality potassium sodium niobate thin films 16 are created.

Furthermore, the electric-field induced strain Z was measured for the samples determined as non-defective products (G) in the non-defective/defective (G/NG) determination described above (sample No. 4, sample Nos. 25 to 40, etc.) with the use of a scanning probe microscope "SPA 400" (trade name from SII NanoTechnology Inc.). The $Z_{max}/V_{max}$ was figured out from the measured maximum applied voltage $V_{max}$ and the maximum electric-field induced strain $Z_{max}$ at the voltage. This value of $Z_{max}/V_{max}$ is regarded as a piezoelectric constant $d_{33}*$. Further, the maximum applied voltage $V_{max}$ is 25 V, and the measuring frequency ranges from 0.5 to 10 Hz. The average value for the values obtained is regarded as the piezoelectric constant $d_{33}*$ of the sample. The measurement results are shown in Tables 7, 8, and 9.

TABLE 7

| Sample No. | x | y | $d_{33}*$ (pm/V) |
|---|---|---|---|
| 25 | 0.25 | 0.85 | 111.0 |
| 26 | 0.30 | 0.85 | 118.5 |
| 27 | 0.35 | 0.85 | 115.0 |

TABLE 7-continued

| Sample No. | x | y | $d_{33}$* (pm/V) |
|---|---|---|---|
| 28 | 0.40 | 0.85 | 111.5 |
| 29 | 0.45 | 0.85 | 105.4 |
| 30 | 0.50 | 0.85 | 121.4 |
| 31 | 0.55 | 0.85 | 117.3 |
| 32 | 0.60 | 0.85 | 110.7 |
| 33 | 0.65 | 0.85 | 113.6 |
| 34 | 0.70 | 0.85 | 116.6 |
| 35 | 0.75 | 0.85 | 126.8 |
| 36 | 0.80 | 0.85 | 145.6 |
| 37 | 0.85 | 0.85 | 150.6 |
| 38 | 0.90 | 0.85 | 153.2 |
| 39 | 0.95 | 0.85 | 155.6 |
| 40 | 1.00 | 0.85 | 160.3 |
| 42 | 0.25 | 0.90 | 109.2 |
| 43 | 0.30 | 0.90 | 110.5 |
| 44 | 0.35 | 0.90 | 108.3 |
| 45 | 0.40 | 0.90 | 106.0 |
| 46 | 0.45 | 0.90 | 107.8 |
| 47 | 0.50 | 0.90 | 120.6 |
| 48 | 0.55 | 0.90 | 117.5 |
| 49 | 0.60 | 0.90 | 113.2 |
| 50 | 0.65 | 0.90 | 112.1 |
| 51 | 0.70 | 0.90 | 111.1 |
| 52 | 0.75 | 0.90 | 127.7 |
| 53 | 0.80 | 0.90 | 143.2 |
| 54 | 0.85 | 0.90 | 140.5 |
| 55 | 0.90 | 0.90 | 153.6 |
| 56 | 0.95 | 0.90 | 160.8 |
| 57 | 1.00 | 0.90 | 159.6 |

TABLE 8

| Sample No. | x | y | $d_{33}$* (pm/V) |
|---|---|---|---|
| 59 | 0.25 | 0.95 | 119.3 |
| 60 | 0.30 | 0.95 | 120.2 |
| 61 | 0.35 | 0.95 | 130.4 |
| 62 | 0.40 | 0.95 | 103.8 |
| 63 | 0.45 | 0.95 | 116.2 |
| 64 | 0.50 | 0.95 | 114.1 |
| 4 | 0.55 | 0.95 | 124.7 |
| 65 | 0.60 | 0.95 | 104.3 |
| 66 | 0.65 | 0.95 | 108.3 |
| 67 | 0.70 | 0.95 | 103.6 |
| 68 | 0.75 | 0.95 | 125.4 |
| 69 | 0.80 | 0.95 | 148.6 |
| 70 | 0.85 | 0.95 | 150.1 |
| 71 | 0.90 | 0.95 | 154.9 |
| 72 | 0.95 | 0.95 | 160.0 |
| 73 | 1.00 | 0.95 | 149.6 |
| 75 | 0.25 | 1.00 | 113.3 |
| 76 | 0.30 | 1.00 | 111.3 |
| 77 | 0.35 | 1.00 | 116.0 |
| 78 | 0.40 | 1.00 | 102.2 |
| 79 | 0.45 | 1.00 | 113.2 |
| 80 | 0.50 | 1.00 | 117.0 |
| 81 | 0.55 | 1.00 | 121.2 |
| 82 | 0.60 | 1.00 | 110.0 |
| 83 | 0.65 | 1.00 | 109.5 |
| 84 | 0.70 | 1.00 | 104.6 |
| 85 | 0.75 | 1.00 | 127.0 |
| 86 | 0.80 | 1.00 | 144.3 |
| 87 | 0.85 | 1.00 | 150.9 |

TABLE 8-continued

| Sample No. | x | y | $d_{33}$* (pm/V) |
|---|---|---|---|
| 88 | 0.90 | 1.00 | 160.5 |
| 89 | 0.95 | 1.00 | 157.6 |
| 90 | 1.00 | 1.00 | 160.6 |

TABLE 9

| Sample No. | x | y | $d_{33}$* (pm/V) |
|---|---|---|---|
| 92 | 0.25 | 1.05 | 111.2 |
| 93 | 0.30 | 1.05 | 110.9 |
| 94 | 0.35 | 1.05 | 112.1 |
| 95 | 0.40 | 1.05 | 104.1 |
| 96 | 0.45 | 1.05 | 110.5 |
| 97 | 0.50 | 1.05 | 118.8 |
| 98 | 0.55 | 1.05 | 119.4 |
| 99 | 0.60 | 1.05 | 111.6 |
| 100 | 0.65 | 1.05 | 110.8 |
| 101 | 0.70 | 1.05 | 107.8 |
| 102 | 0.75 | 1.05 | 122.4 |
| 103 | 0.80 | 1.05 | 142.9 |
| 104 | 0.85 | 1.05 | 144.5 |
| 105 | 0.90 | 1.05 | 149.0 |
| 106 | 0.95 | 1.05 | 150.6 |
| 107 | 1.00 | 1.05 | 152.3 |
| 109 | 0.25 | 1.10 | 107.3 |
| 110 | 0.30 | 1.10 | 102.4 |
| 111 | 0.35 | 1.10 | 101.5 |
| 112 | 0.40 | 1.10 | 100.5 |
| 113 | 0.45 | 1.10 | 110.1 |
| 114 | 0.50 | 1.10 | 119.8 |
| 115 | 0.55 | 1.10 | 117.7 |
| 116 | 0.60 | 1.10 | 115.7 |
| 117 | 0.65 | 1.10 | 110.6 |
| 118 | 0.70 | 1.10 | 105.5 |
| 119 | 0.75 | 1.10 | 120.6 |
| 120 | 0.80 | 1.10 | 140.7 |
| 121 | 0.85 | 1.10 | 142.8 |
| 122 | 0.90 | 1.10 | 151.7 |
| 123 | 0.95 | 1.10 | 159.3 |
| 124 | 1.00 | 1.10 | 152.8 |

From Tables 7 to 9, it is determined that the piezoelectric constant $d_{33}$* ranges from 100.5 to 160.8 pm/V, and achieves numerical values equal to or more than 124.0 pm/V for the sample No. 1 (containing no $BaZrO_3$).

In particular, it is determined that in the case of the samples in which the range of x is $0.80 \leq x \leq 1.00$ (sample Nos. 36 to 40, etc.), the piezoelectric constant $d_{33}$* ranges from 140.5 to 160.8 pm/V, which are extremely large numerical values as compared with 124.0 pm/V of the sample No. 1 (containing no $BaZrO_3$).

Table 10 shows: the leakage current in an electric field of 200 kV/cm; the dielectric constant $\in$ and tan δ at a frequency of 1 kHz; and the values of spontaneous polarization $P_s$ and piezoelectric constant $d_{33}$* measured at a measuring frequency of 10 kHz and an applied electric field of 500 kV/cm in the case of 0.97 $(K_{0.1}Na_{0.9})Nb_{0.950}O_3$-0.03M1$ZrO_3$ (M1=Ca, Sr) with x=0.90, y=0.95, and n=0.03 (sample Nos. 142 and 143).

TABLE 10

| Sample No. | M1 | Leakage Current (A/cm²) @200 kV/cm | $\epsilon$ @1 kHz | tanδ (%) @1 kHz | $P_s$ (μC/cm²) | $d_{33}$* (pm/V) | G/NG Determination |
|---|---|---|---|---|---|---|---|
| 142 | Ca | 4.23 × 10⁻⁶ | 950 | 2.03 | 21 | 150.4 | G |
| 143 | Sr | 6.91 × 10⁻⁶ | 824 | 2.11 | 23 | 152.1 | G |

From Table 10, the sample with M1=Ca (sample No. 142) is 4.23×10⁻⁶ A/cm² in leakage current, which is low. Furthermore, the spontaneous polarization $P_s$ is 21 μC/cm², and the ferroelectricity was thus also maintained. Accordingly, the sample with M1=Ca (Sample No. 142) was determined as a non-defective product (G).

In addition, the sample with M1=Sr (sample No. 143) is 6.91×10⁻⁶ A/cm² in leakage current, which is also low. Furthermore, the spontaneous polarization $P_s$ is 23 μC/cm², and the ferroelectricity was thus also maintained. Accordingly, the sample with M1=Sr (Sample No. 143) was determined as a non-defective product (G).

Further, these samples with M1=Ca, Sr (samples Nos. 142 and 143) respectively have piezoelectric constants $d_{33}$* of 150.4 pm/V and 152.1 pm/V, and have improvements in piezoelectric constant $d_{33}$* observed as compared with the sample containing no M1ZrO₃ (M1=Ca, Sr).

In the second embodiment, the evaluations were made on the samples containing 2 mol of Mn with respect to 100 mol of $(K_{1-x}Na_x)Nb_yO_3$. However, evaluation results similar to those in the second embodiment were achieved on samples containing 10 mol of Mn or less with respect to 100 mol of the main constituent 0.97 $(K_{1-x}Na_x)Nb_yO_3$-0.03M1ZrO₃ (M1=Ca, Sr, Ba).

Accordingly, from the evaluation results in this second embodiment, it has been revealed that piezoelectric thin film elements which have excellent leakage current characteristics, ferroelectric characteristics, and piezoelectric characteristics are achieved by meeting 0.25≤x≤1.00 and 0.85≤y≤1.10 in the potassium sodium niobate thin film represented by the general formula $(1-n)(K_{1-x}Na_x)Nb_yO_3$-nM1ZrO₃ (M1=Ca, Sr, Ba) as the piezoelectric thin film 16.

Figure 3:
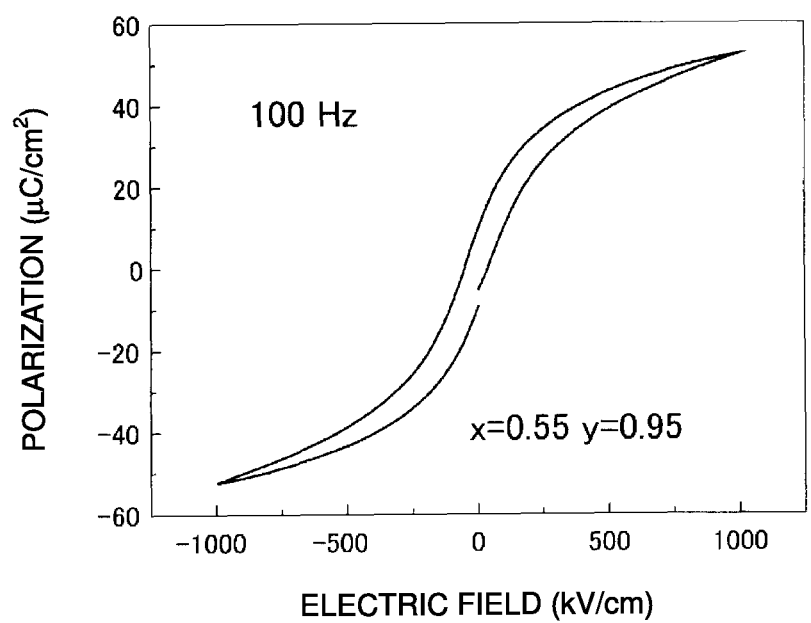
FIG. 3 is a graph showing a hysteresis curve for a piezoelectric thin film element with the use of a potassium sodium niobate thin film with BaZrO$_3$ as a solid solution.

FIG. 3 shows a ferroelectric hysteresis curve for the sample No. 4. It is determined that BaZrO₃ in the potassium sodium niobate as a solid solution improves the leakage current characteristics in electric fields of 100 kV/cm or more, and exhibits the favorable ferroelectric hysteresis curve even at the maximum applied voltage of 1 MV/cm and the measuring frequency of 100 Hz.

As just described, a piezoelectric thin film element which has excellent leakage current characteristics, ferroelectric characteristics, and piezoelectric characteristics is achieved by adjusting the ranges of x, y, and n respectively to 0.25≤x≤1.00, 0.85≤y≤1.10, and 0.01≤n≤0.10 in the potassium sodium niobate thin film represented by the general formula for piezoelectric thin films: $(1-n)(K_{1-x}Na_x)Nb_yO_3$-nM1ZrO₃ (M1=Ca, Sr, Ba) in the piezoelectric thin film element according to the present invention. Furthermore, the change in electrostatic capacitance with temperature is suppressed which is problematic in the use of ferroelectric thin film elements or piezoelectric thin film elements.

Manufacture of Piezoelectric Thin Film Element According to Third Embodiment

A piezoelectric thin film element according to a third embodiment is configured in the same fashion as the piezoelectric thin film element shown in FIG. 2 according to the first embodiment.

It is to be noted that the content of BaSnO₃ in a potassium sodium niobate thin film represented by the general formula $(1-n)(K_{1-x}Na_x)Nb_yO_3$-nBaSnO₃ as the piezoelectric thin film 16 is varied in the third embodiment.

The piezoelectric thin film 16, that is, potassium sodium niobate (KNN) thin film 16 is created by using a chemical solution deposition method.

First, potassium ethoxide, sodium ethoxide, pentaethoxy niobium, manganese acetylacetonato, barium ethoxide, and tetraisopropoxy tin as raw materials are prepared to meet 0.52×(1−n): 0.72×(1−n): 0.95×(1−n): 0.02×(1−n): n:n in terms of molar ratio. In the case of the present third embodiment herein, seven types of 0.00, 0.005, 0.01, 0.03, 0.05, 0.1, and 0.12 are selected as n.

Next, the potassium ethoxide, sodium ethoxide, pentaethoxy niobium, manganese acetylacetonato, barium ethoxide, and tetraisopropoxy tin as raw materials are mixed into a 2-methoxyethanol solvent in a glove box.

Next, the mixed solution is refluxed at 125° C. for 16 hours in a nitrogen atmosphere to provide a potassium sodium niobate (KNN) precursor solution (also referred to as a solution for chemical solution deposition) that has a concentration of 0.3 M.

On the other hand, the lower electrode 14 is formed on the Si substrate 12 by a magnetron DC sputtering method. Pt or the like is used as a material for the lower electrode 14.

The sputtering conditions include the sputtering output: 100 W; the sputtering time: 5 minutes; the temperature of the substrate 12: 300° C.; and the degree of vacuum: 5 millitorr.

Next, the potassium sodium niobate precursor solution is applied by spin coating onto the lower electrode 14 in a dry gas.

Next, a first heat treatment (preparatory heat treatment or drying treatment) is carried out. More specifically, the potassium sodium niobate precursor solution applied onto the lower electrode 14 is heated at a rate of temperature increase of 120° C./min with the use of a hot plate heated in advance to a temperature of 350° C., and dried at 350° C. for 3 minutes.

Next, a second heat treatment (main heat treatment or firing treatment) is carried out. More specifically, the dried potassium sodium niobate precursor film is heated up at a rate of temperature increase of 5° C./min or less in the temperature range of 350° C. to 750° C. (including temperatures around 500° C., which rapidly decompose complexes formed by reflux), and subjected to firing for 10 minutes at a temperature of 750° C. Thus, the potassium sodium niobate layer 16a is formed. The potassium sodium niobate layer 16a formed by the single process described previously is 30 nm in thickness.

Furthermore, the process for forming the potassium sodium niobate layer 16a is repeated 10 times to form a potassium sodium niobate thin film 16 that has a composition of $(1-n)(K_{0.45}Na_{0.55})Nb_{0.95}O_3$-nBaSnO₃ with a film thickness of 300 nm.

Next, the upper electrode 18 is formed by a magnetron DC sputtering method onto the potassium sodium niobate thin film 16. Pt or the like is used as a material for the upper electrode 18.

The sputtering conditions include the sputtering output: 100 W; the sputtering time: 5 minutes; the temperature of the substrate 12: 150° C.; and the degree of vacuum: 5 millitorr.

Thus, a piezoelectric thin film element is obtained.

It has been confirmed by composition analysis with Inductively Coupled Plasma (ICP) that the composition of the potassium sodium niobate thin film 16 is bang on target.

Evaluation of Piezoelectric Thin Film Element According to Third Embodiment

Table 11 shows electrical characteristics of the piezoelectric thin film element in the case of varying the proportion n of $BaSnO_3$ from 0.00 (sample No. 201), through 0.005 (sample No. 202), 0.01 (sample No. 203), 0.03 (sample No. 204), and 0.10 (sample No. 205), to 0.12 (sample No. 206). Items for the electrical characteristics are insulation properties, dielectric constant $\epsilon$, tan $\delta$, and ferroelectric characteristics.

TABLE 11

| Sample No. | n | LeakageCurrent $(A/cm^2)$ @200 kV/cm | $\epsilon$ @1 kHz | tan$\delta$ (%) @1 kHz | $P_s$ ($\mu C/cm^2$) | G/NG Determination |
|---|---|---|---|---|---|---|
| 201* | 0 | $5.43 \times 10^{-4}$ | 726 | 2.12 | 28 | NG |
| 202* | 0.005 | $5.22 \times 10^{-5}$ | 720 | 2.38 | 23 | NG |
| 203 | 0.01 | $3.26 \times 10^{-6}$ | 710 | 2.15 | 18 | G |
| 204 | 0.03 | $1.17 \times 10^{-7}$ | 677 | 2.29 | 14 | G |
| 205 | 0.1 | $2.38 \times 10^{-7}$ | 575 | 2.22 | 11 | G |
| 206* | 0.12 | $1.98 \times 10^{-7}$ | 530 | 2.3 | 8 | NG |

Mark *: outside the scope of the present invention

The sample No. 201 (n=0.00, containing no $BaSnO_3$) and the sample No. 202 (n=0.005) were determined as defective products (NG) because of the leakage currents of $5.43 \times 10^{-5}$ $A/cm^2$ or more. The sample No. 206 (n=0.12) was determined as a defective product (NG) because of the saturation polarization Ps less than 10 $\mu C/cm^2$. On the other hand, the sample No. 203 (n=0.01), sample No. 204 (n=0.03), and sample No. 205 (n=0.10) were determined as non-defective products (G) because of the leakage currents of $5.43 \times 10^{-5}$ $A/cm^2$ or less and the saturation polarization Ps of 10 $\mu C/cm^2$ or more.

More specifically, in the case of sample No. 202, the leakage current of $8.22 \times 10^{-5}$ $A/cm^2$ is rarely different from $5.43 \times 10^{-4}$ $A/cm^2$ as the leakage current of sample No. 201 (containing no $BaSnO_3$). However, the sample No. 203, the sample No. 204, the sample No. 205, and the sample No. 206, which are respectively $3.26 \times 10^{-6}$ $A/cm^2$, $1.17 \times 10^{-7}$ $A/cm^2$, $2.38 \times 10^{-7}$ $A/cm^2$, and $1.98 \times 10^{-7}$ $A/cm^2$ in leakage current, have achieved favorable leakage current characteristics.

Furthermore, the sample Nos. 201 to 206, which are respectively 28 $\mu C/cm^2$, 23 $\mu C/cm^2$, 18 $\mu C/cm^2$, 14 $\mu C/cm^2$, 11 $\mu C/cm^2$, and 8 $\mu C/cm^2$ in saturation polarization Ps, have a tendency to decrease the saturation polarization Ps as n is increased (in other words, the proportion of $BaSnO_3$ is increased). Further, the sample No. 206 (n=0.12) has substantially decreased saturation polarization Ps less than 10 $\mu C/cm^2$.

From the foregoing description, it is determined that the potassium sodium niobate thin film 16 with $BaSnO_3$ as a solid solution in the range of $0.01 \leq n \leq 0.10$ with respect to $(K_{0.45}Na_{0.55})Nb_{0.95}O_3$ can improve the leakage current characteristics while maintaining excellent ferroelectric characteristics.

Furthermore, the piezoelectric constants $d_{33}*$ of the sample Nos. 201 to 206 were obtained in the same manner as in the first embodiment described previously. The measurement results are shown in Table 12.

TABLE 12

| Sample No. | n | $d_{33}*$ (pm/V) |
|---|---|---|
| 201* | 0.00 | 124.0 |
| 202* | 0.005 | 119.2 |
| 203 | 0.01 | 115.3 |
| 204 | 0.03 | 107.9 |
| 205 | 0.10 | 112.6 |
| 206* | 0.12 | 70.5 |

Mark *outside the scope of the present invention

The piezoelectric constants $d_{33}*$ of the sample Nos. 202 to 205 are respectively 119.2 pm/V, 115.3 pm/V, 107.9 pm/V, and 112.6 pm/V, which are values comparable to 124.0 pm/V of the sample No. 201 (containing no $BaSnO_3$). On the other hand, the sample No. 206 (n=0.12) has a drastically decreased piezoelectric constant $d_{33}*$ of 70.5 pm/V. This is because the spontaneous polarization Ps is an extremely small value of 10 $\mu C/cm^2$ or less.

In the third embodiment, the evaluations were made on the samples containing 2 mol of Mn with respect to 100 mol of $(K_{0.45}Na_{0.55})Nb_{0.95}O_3$. However, evaluation results similar to those in the third embodiment were achieved on samples containing 10 mol of Mn or less with respect to 100 mol of the main constituent $(1-n)(K_{0.45}Na_{0.55})Nb_{0.95}O_3$-$nBaSnO_3$.

Manufacture of Piezoelectric Thin Film Element According to Fourth Embodiment A piezoelectric thin film element according to a fourth embodiment is configured in the same fashion as the piezoelectric thin film element shown in FIG. 2 according to the first embodiment.

It is to be noted that the x and y in a potassium sodium niobate thin film represented by the general formula $(1-n)(K_{1-x}Na_x)Nb_yO_3$-$nBaSnO_3$ as the piezoelectric thin film 16 are varied in the fourth embodiment.

The piezoelectric thin film 16, that is, potassium sodium niobate (KNN) thin film 16 is created by using a chemical solution deposition method.

First, potassium ethoxide, sodium ethoxide, pentaethoxy niobium, manganese acetylacetonato, barium ethoxide, and tetraisopropoxy tin as raw materials are prepared to meet (1.07−x)×0.97: (x+0.17)×0.97:y×0.97:0.02×0.97:0.03:0.03 in terms of molar ratio. In the case of the fourth embodiment herein, x and y respectively satisfy a conditional expression 0.2≤x≤1.00 and a conditional expression 0.85≤y≤1.10.

Thereafter, a piezoelectric thin film element including a substrate 12, a lower electrode 14 formed on the substrate 12, a piezoelectric thin film 16 formed on the lower electrode 14, and an upper electrode 18 formed on the piezoelectric thin film 16 is created by the same method as in the third embodiment.

The piezoelectric thin film 16 is a potassium sodium niobate (KNN) thin film that has a composition of 0.97 $(K_{1-x}Na_x)Nb_yO_3$-0.03BaSnO$_3$ (0.2≤x≤1.00, 0.85≤y≤1.10) with a film thickness of 300 nm.

Evaluation of Piezoelectric Thin Film Element According to Fourth Embodiment

Tables 13, 14, and 15 show: the leakage current in an electric field of 200 kV/cm; the dielectric constant ∈ and tan δ at a frequency of 1 kHz; and the value of saturation polarization Ps measured at a measuring frequency of 10 kHz and an applied electric field of 500 kV/cm, in the case of varying the x and y in 0.97 $(K_{1-x}Na_x)Nb_yO_3$-0.03BaSnO$_3$ in the ranges of 0.2≤x≤1.00 and 0.85≤y≤1.10 (sample No. 204, sample Nos. 207 to 307). It is to be noted that, in the same manner as in the third embodiment, in the case of the leakage current of 5.43×10$^{-5}$ A/cm$^2$ or less and the saturation polarization Ps of 10 μC/cm$^2$ or more, the sample was determined as a non-defective product (G), whereas the sample was determined as a defective product (NG) in all other cases.

TABLE 13

| Sample No. | x | y | Leakage Current (A/cm$^2$) @200 kV/cm | ∈ @1 kHz | tanδ (%) @1 kHz | P$_s$ (μC/cm$^2$) | G/NG Determination |
|---|---|---|---|---|---|---|---|
| 207* | 0.20 | 0.85 | 3.00 × 10$^{-1}$ | 873 | 2.76 | Unmeasurable | NG |
| 208* | 0.25 | 0.85 | 1.15 × 10$^{-2}$ | 912 | 2.54 | Unmeasurable | NG |
| 209* | 0.30 | 0.85 | 4.95 × 10$^{-3}$ | 859 | 1.96 | Unmeasurable | NG |
| 210* | 0.35 | 0.85 | 5.27 × 10$^{-2}$ | 1060 | 2.87 | Unmeasurable | NG |
| 211* | 0.40 | 0.85 | 8.66 × 10$^{-2}$ | 969 | 2.07 | Unmeasurable | NG |
| 212* | 0.45 | 0.85 | 7.71 × 10$^{-4}$ | 921 | 2.18 | Unmeasurable | NG |
| 213* | 0.50 | 0.85 | 3.12 × 10$^{-4}$ | 988 | 2.65 | Unmeasurable | NG |
| 214* | 0.55 | 0.85 | 7.21 × 10$^{-2}$ | 919 | 2.14 | Unmeasurable | NG |
| 215* | 0.60 | 0.85 | 8.19 × 10$^{-3}$ | 1056 | 1.97 | Unmeasurable | NG |
| 216* | 0.65 | 0.85 | 3.86 × 10$^{-2}$ | 882 | 2.55 | Unmeasurable | NG |
| 217* | 0.70 | 0.85 | 1.36 × 10$^{-2}$ | 1041 | 2.82 | Unmeasurable | NG |
| 218* | 0.75 | 0.85 | 9.96 × 10$^{-3}$ | 902 | 3.99 | Unmeasurable | NG |
| 219* | 0.80 | 0.85 | 4.32 × 10$^{-2}$ | 921 | 2.15 | Unmeasurable | NG |
| 220* | 0.85 | 0.85 | 4.56 × 10$^{-2}$ | 997 | 3.01 | Unmeasurable | NG |
| 221* | 0.90 | 0.85 | 3.36 × 10$^{-2}$ | 1022 | 2.82 | Unmeasurable | NG |
| 222* | 0.95 | 0.85 | 7.54 × 10$^{-3}$ | 837 | 2.76 | Unmeasurable | NG |
| 223* | 1.00 | 0.85 | 4.22 × 10$^{-2}$ | 1004 | 2.88 | Unmeasurable | NG |
| 224* | 0.20 | 0.90 | 5.39 × 10$^{-5}$ | 1094 | 2.28 | 21 | NG |
| 225 | 0.25 | 0.90 | 2.33 × 10$^{-6}$ | 936 | 1.64 | 19 | G |
| 226 | 0.30 | 0.90 | 1.51 × 10$^{-6}$ | 796 | 1.75 | 17 | G |
| 227 | 0.35 | 0.90 | 1.77 × 10$^{-6}$ | 753 | 1.58 | 15 | G |
| 228 | 0.40 | 0.90 | 1.67 × 10$^{-6}$ | 758 | 2.30 | 15 | G |
| 229 | 0.45 | 0.90 | 1.52 × 10$^{-6}$ | 796 | 1.90 | 17 | G |
| 230 | 0.50 | 0.90 | 1.38 × 10$^{-6}$ | 830 | 2.27 | 18 | G |
| 231 | 0.55 | 0.90 | 1.49 × 10$^{-6}$ | 748 | 2.07 | 30 | G |
| 232 | 0.60 | 0.90 | 1.60 × 10$^{-6}$ | 772 | 2.12 | 32 | G |
| 233 | 0.65 | 0.90 | 2.77 × 10$^{-6}$ | 844 | 2.11 | 30 | G |
| 234 | 0.70 | 0.90 | 1.97 × 10$^{-6}$ | 840 | 1.67 | 31 | G |
| 235 | 0.75 | 0.90 | 7.88 × 10$^{-7}$ | 868 | 2.15 | 30 | G |
| 236 | 0.80 | 0.90 | 2.09 × 10$^{-6}$ | 1128 | 2.41 | 32 | G |
| 237 | 0.85 | 0.90 | 2.56 × 10$^{-6}$ | 1150 | 2.46 | 30 | G |
| 238 | 0.90 | 0.90 | 1.90 × 10$^{-6}$ | 1143 | 2.55 | 31 | G |
| 239 | 0.95 | 0.90 | 1.79 × 10$^{-6}$ | 1193 | 2.80 | 32 | G |
| 240 | 1.00 | 0.90 | 2.21 × 10$^{-6}$ | 1177 | 2.93 | 32 | G |

Mark *: outside the scope of the present invention

TABLE 14

| Sample No. | x | y | Leakage Current (A/cm$^2$) @200 kV/cm | ∈ @1 kHz | tanδ (%) @1 kHz | P$_s$ (μC/cm$^2$) | G/NG Determination |
|---|---|---|---|---|---|---|---|
| 241* | 0.20 | 0.95 | 6.56 × 10$^{-3}$ | 806 | 1.58 | 19 | NG |
| 242 | 0.25 | 0.95 | 2.59 × 10$^{-6}$ | 825 | 1.74 | 20 | G |
| 243 | 0.30 | 0.95 | 2.09 × 10$^{-6}$ | 835 | 1.73 | 20 | G |
| 244 | 0.35 | 0.95 | 2.54 × 10$^{-6}$ | 748 | 1.56 | 18 | G |
| 245 | 0.40 | 0.95 | 2.24 × 10$^{-6}$ | 715 | 1.79 | 15 | G |

TABLE 14-continued

| Sample No. | x | y | Leakage Current (A/cm$^2$) @200 kV/cm | $\epsilon$ @1 kHz | tan$\delta$ (%) @1 kHz | $P_s$ ($\mu$C/cm$^2$) | G/NG Determination |
|---|---|---|---|---|---|---|---|
| 246 | 0.45 | 0.95 | 8.47 × 10$^{-6}$ | 840 | 2.44 | 19 | G |
| 247 | 0.50 | 0.95 | 2.54 × 10$^{-6}$ | 748 | 2.24 | 15 | G |
| 204 | 0.55 | 0.95 | 1.17 × 10$^{-7}$ | 677 | 2.29 | 14 | G |
| 248 | 0.60 | 0.95 | 1.05 × 10$^{-6}$ | 686 | 1.86 | 19 | G |
| 249 | 0.65 | 0.95 | 6.59 × 10$^{-6}$ | 883 | 2.80 | 20 | G |
| 250 | 0.70 | 0.95 | 1.65 × 10$^{-6}$ | 792 | 2.35 | 18 | G |
| 251 | 0.75 | 0.95 | 3.43 × 10$^{-6}$ | 960 | 2.40 | 25 | G |
| 252 | 0.80 | 0.95 | 6.09 × 10$^{-6}$ | 916 | 2.46 | 18 | G |
| 253 | 0.85 | 0.95 | 5.63 × 10$^{-6}$ | 1021 | 2.55 | 20 | G |
| 254 | 0.90 | 0.95 | 4.68 × 10$^{-6}$ | 985 | 2.64 | 21 | G |
| 255 | 0.95 | 0.95 | 6.66 × 10$^{-7}$ | 991 | 2.80 | 24 | G |
| 256 | 1.00 | 0.95 | 7.46 × 10$^{-6}$ | 1006 | 2.16 | 25 | G |
| 257* | 0.20 | 1.00 | 2.64 × 10$^{-3}$ | 758 | 1.81 | 22 | NG |
| 258 | 0.25 | 1.00 | 5.33 × 10$^{-6}$ | 734 | 1.72 | 20 | G |
| 259 | 0.30 | 1.00 | 4.96 × 10$^{-6}$ | 763 | 2.18 | 17 | G |
| 260 | 0.35 | 1.00 | 3.54 × 10$^{-6}$ | 744 | 2.02 | 17 | G |
| 261 | 0.40 | 1.00 | 1.07 × 10$^{-6}$ | 763 | 2.20 | 18 | G |
| 262 | 0.45 | 1.00 | 1.25 × 10$^{-6}$ | 734 | 1.93 | 19 | G |
| 263 | 0.50 | 1.00 | 7.73 × 10$^{-6}$ | 772 | 2.05 | 19 | G |
| 264 | 0.55 | 1.00 | 5.65 × 10$^{-6}$ | 701 | 2.26 | 20 | G |
| 265 | 0.60 | 1.00 | 1.30 × 10$^{-5}$ | 657 | 2.03 | 18 | G |
| 266 | 0.65 | 1.00 | 1.07 × 10$^{-6}$ | 643 | 2.55 | 26 | G |
| 267 | 0.70 | 1.00 | 2.41 × 10$^{-6}$ | 653 | 2.37 | 15 | G |
| 268 | 0.75 | 1.00 | 9.91 × 10$^{-6}$ | 648 | 2.54 | 19 | G |
| 269 | 0.80 | 1.00 | 7.79 × 10$^{-6}$ | 614 | 2.44 | 22 | G |
| 270 | 0.85 | 1.00 | 6.43 × 10$^{-6}$ | 740 | 2.43 | 22 | G |
| 271 | 0.90 | 1.00 | 8.11 × 10$^{-6}$ | 721 | 2.22 | 23 | G |
| 272 | 0.95 | 1.00 | 6.43 × 10$^{-6}$ | 705 | 2.83 | 23 | G |
| 273 | 1.00 | 1.00 | 4.23 × 10$^{-6}$ | 763 | 2.09 | 24 | G |

Mark *: outside the scope of the present invention

TABLE 15

| Sample No. | x | y | Leakage Current (A/cm$^2$) @200 kV/cm | $\epsilon$ @1 kHz | tan$\delta$ (%) @1 kHz | $P_s$ ($\mu$C/cm$^2$) | G/NG Determination |
|---|---|---|---|---|---|---|---|
| 274* | 0.20 | 1.05 | 8.95 × 10$^{-3}$ | 772 | 2.41 | 22 | NG |
| 275 | 0.25 | 1.05 | 2.68 × 10$^{-6}$ | 629 | 1.91 | 20 | G |
| 276 | 0.30 | 1.05 | 3.65 × 10$^{-6}$ | 626 | 2.90 | 17 | G |
| 277 | 0.35 | 1.05 | 8.51 × 10$^{-6}$ | 596 | 2.81 | 17 | G |
| 278 | 0.40 | 1.05 | 4.87 × 10$^{-6}$ | 611 | 2.65 | 17 | G |
| 279 | 0.45 | 1.05 | 2.06 × 10$^{-6}$ | 634 | 2.32 | 18 | G |
| 280 | 0.50 | 1.05 | 1.12 × 10$^{-6}$ | 679 | 2.34 | 21 | G |
| 281 | 0.55 | 1.05 | 7.95 × 10$^{-6}$ | 608 | 2.04 | 17 | G |
| 282 | 0.60 | 1.05 | 5.19 × 10$^{-6}$ | 667 | 2.11 | 19 | G |
| 283 | 0.65 | 1.05 | 3.41 × 10$^{-6}$ | 648 | 2.48 | 20 | G |
| 284 | 0.70 | 1.05 | 4.60 × 10$^{-5}$ | 684 | 2.67 | 17 | G |
| 285 | 0.75 | 1.05 | 1.63 × 10$^{-6}$ | 686 | 2.39 | 19 | G |
| 286 | 0.80 | 1.05 | 4.42 × 10$^{-6}$ | 624 | 2.96 | 23 | G |
| 287 | 0.85 | 1.05 | 8.64 × 10$^{-6}$ | 650 | 2.66 | 24 | G |
| 288 | 0.90 | 1.05 | 7.43 × 10$^{-6}$ | 663 | 2.42 | 22 | G |
| 289 | 0.95 | 1.05 | 1.59 × 10$^{-5}$ | 709 | 2.44 | 24 | G |
| 290 | 1.00 | 1.05 | 4.55 × 10$^{-6}$ | 693 | 2.80 | 21 | G |
| 291* | 0.20 | 1.10 | 4.98 × 10$^{-2}$ | 787 | 3.01 | Unmeasurable | NG |
| 292* | 0.25 | 1.10 | 3.14 × 10$^{-2}$ | 523 | 2.09 | Unmeasurable | NG |
| 293* | 0.30 | 1.10 | 5.42 × 10$^{-3}$ | 489 | 3.62 | Unmeasurable | NG |
| 294* | 0.35 | 1.10 | 2.40 × 10$^{-3}$ | 448 | 5.60 | Unmeasurable | NG |
| 295* | 0.40 | 1.10 | 1.95 × 10$^{-4}$ | 459 | 5.09 | Unmeasurable | NG |
| 296* | 0.45 | 1.10 | 9.83 × 10$^{-4}$ | 534 | 4.70 | Unmeasurable | NG |
| 297* | 0.50 | 1.10 | 1.13 × 10$^{-4}$ | 585 | 4.62 | Unmeasurable | NG |
| 298* | 0.55 | 1.10 | 1.30 × 10$^{-4}$ | 516 | 5.81 | Unmeasurable | NG |
| 299* | 0.60 | 1.10 | 4.67 × 10$^{-3}$ | 677 | 4.19 | Unmeasurable | NG |
| 300* | 0.65 | 1.10 | 1.42 × 10$^{-3}$ | 653 | 4.40 | Unmeasurable | NG |
| 301* | 0.70 | 1.10 | 1.86 × 10$^{-3}$ | 715 | 2.96 | Unmeasurable | NG |
| 302* | 0.75 | 1.10 | 2.71 × 10$^{-2}$ | 725 | 4.23 | Unmeasurable | NG |
| 303* | 0.80 | 1.10 | 8.84 × 10$^{-2}$ | 633 | 4.38 | Unmeasurable | NG |
| 304* | 0.85 | 1.10 | 9.46 × 10$^{-3}$ | 716 | 3.39 | Unmeasurable | NG |

TABLE 15-continued

| Sample No. | x | y | Leakage Current (A/cm$^2$) @200 kV/cm | $\epsilon$ @1 kHz | tan$\delta$ (%) @1 kHz | $P_s$ ($\mu$C/cm$^2$) | G/NG Determination |
|---|---|---|---|---|---|---|---|
| 305* | 0.90 | 1.10 | 8.88 × 10$^{-3}$ | 722 | 4.00 | Unmeasurable | NG |
| 306* | 0.95 | 1.10 | 7.46 × 10$^{-3}$ | 699 | 3.84 | Unmeasurable | NG |
| 307* | 1.00 | 1.10 | 9.10 × 10$^{-3}$ | 706 | 2.97 | Unmeasurable | NG |

Mark *: outside the scope of the present invention

The sample Nos. 207 to 223 in Table 13 refer to samples in the case of varying x in the range of 0.20≤x≤1.00 with y=0.85. These samples are high in leakage current from 3.12×10$^{-4}$ A/cm$^2$ to 3.00×10$^{-1}$ A/cm$^2$, from which the effect of BaSnO$_3$ in a solid solution is not observed. Accordingly, the sample Nos. 207 to 223 were determined as defective products (NG). This is because the molar ratio between (K$_{1-x}$, Na$_x$, Ba) at the site A and (Nb$_y$, Sn) at the site B significantly deviates from the stoichiometric composition.

The sample Nos. 224 to 240 refer to samples in the case of varying x in the range of 0.20≤x≤1.00 with y=0.90. Among the samples, the leakage current of the sample with x=0.20 (sample No. 224) is 6.39×10$^{-5}$ A/cm$^2$. The sample was determined as a defective product (NG) because the value was little different from that of the sample No. 201 containing no BaSnO$_3$.

On the other hand, the leakage currents of the samples with 0.25≤x≤1.00 (the sample Nos. 225 to 240) range from 7.88×10$^{-7}$ A/cm$^2$ to 2.77×10$^{-6}$ A/cm$^2$. These values show significant improvements in leakage current as compared with the sample No. 201 containing no BaSnO$_3$. Furthermore, the saturation polarization Ps ranges from 15 to 32 $\mu$C/cm$^2$, and the ferroelectric characteristics were thus also maintained. Accordingly, the samples with 0.25≤x≤1.00 (the sample Nos. 225 to 240) were determined as non-defective products (G).

The sample No. 204 and Nos. 241 to 256 in Table 14 refer to samples in the case of varying x in the range of 0.20≤x≤1.00 with y=0.95. Among the samples, the leakage current of the sample with x=0.20 (sample No. 241) is 6.56×10$^{-3}$ A/cm$^2$. The sample was determined as a defective product (NG) because the value was worse than that of the sample No. 201 containing no BaSnO$_3$.

On the other hand, the leakage currents of the samples with 0.25≤x≤1.00 (the sample No. 204 and sample Nos. 242 to 256) range from 1.17×10$^{-7}$ A/cm$^2$ to 8.47×10$^{-6}$ A/cm$^2$. These values show significant improvements in leakage current as compared with the sample No. 201 containing no BaSnO$_3$. Furthermore, the saturation polarization Ps ranges from 14 to 25 $\mu$C/cm$^2$, and the ferroelectric characteristics were thus also maintained. Accordingly, the samples with 0.25≤x≤1.00 (the sample No. 204 and sample Nos. 242 to 256) were determined as non-defective products (G).

The sample Nos. 257 to 273 refer to samples in the case of varying x in the range of 0.20≤x≤1.00 with y=1.00. Among the samples, the leakage current of the sample with x=0.20 (sample No. 257) is 2.64×10$^{-3}$ A/cm$^2$. The sample was determined as a defective product (NG) because the value was worse than that of the sample No. 201 containing no BaSnO$_3$.

On the other hand, the leakage currents of the samples with 0.25≤x≤1.00 (the sample Nos. 258 to 273) range from 1.07×10$^{-6}$ A/cm$^2$ to 1.30×10$^{-5}$ A/cm$^2$. These values show significant improvements in leakage current as compared with the sample No. 201 containing no BaSnO$_3$. Furthermore, the saturation polarization Ps ranges from 15 to 26 $\mu$C/cm$^2$, and the ferroelectric characteristics were thus also maintained. Accordingly, the samples with 0.25≤x≤1.00 (the sample Nos. 258 to 273) were determined as non-defective products (G).

The sample Nos. 274 to 290 in Table 15 refer to samples in the case of varying x in the range of 0.20≤x≤1.00 with y=1.05. Among the samples, the leakage current of the sample with x=0.20 (sample No. 274) is 8.95×10$^{-3}$ A/cm$^2$. The sample was determined as a defective product (NG) because the value was worse than that of the sample No. 201 containing no BaSnO$_3$.

On the other hand, the leakage currents of the samples with 0.25≤x≤1.00 (the sample Nos. 275 to 290) range from 1.12×10$^{-6}$ A/cm$^2$ to 4.60×10$^{-5}$ A/cm$^2$. These values show significant improvements in leakage current as compared with the sample No. 201 containing no BaSnO$_3$. Furthermore, the saturation polarization Ps ranges from 17 to 24 $\mu$C/cm$^2$, and the ferroelectric characteristics were thus also maintained. Accordingly, the samples with 0.25≤x≤1.00 (the sample Nos. 275 to 290) were determined as non-defective products (G).

The sample Nos. 291 to 307 refer to samples in the case of varying x in the range of 0.20≤x≤1.00 with y=1.10. These samples are high in leakage current from 1.13×10$^{-4}$ A/cm$^2$ to 8.84×10$^{-2}$ A/cm$^2$, from which the effect of BaSnO$_3$ in a solid solution is not observed. Accordingly, the sample Nos. 291 to 307 were determined as defective products (NG). This is because the molar ratio between (K$_{1-x}$, Na$_y$, Ba) at the site A and (Nb$_y$, Sn) at the site B significantly deviates from the stoichiometric composition.

In addition, the samples determined as non-defective products (G) are all 3% or less in tan $\delta$, which is extremely low. Therefore, it is determined that high-quality potassium sodium niobate thin films 16 are created.

Furthermore, the piezoelectric constant d$_{33}$* was figured out in the same way as in the second embodiment described previously, for the samples determined as non-defective products (G) in the non-defective/defective (G/NG) determination described above (sample No. 204, sample Nos. 225 to 240, etc.). The measurement results are shown in Tables 16 and 17.

TABLE 16

| Sample No. | x | y | d$_{33}$* (pm/V) |
|---|---|---|---|
| 225 | 0.25 | 0.90 | 109.0 |
| 226 | 0.30 | 0.90 | 102.3 |
| 227 | 0.35 | 0.90 | 104.1 |
| 228 | 0.40 | 0.90 | 105.8 |
| 229 | 0.45 | 0.90 | 103.6 |
| 230 | 0.50 | 0.90 | 101.3 |

TABLE 16-continued

| Sample No. | x | y | $d_{33}$* (pm/V) |
|---|---|---|---|
| 231 | 0.55 | 0.90 | 105.4 |
| 232 | 0.60 | 0.90 | 109.5 |
| 233 | 0.65 | 0.90 | 108.4 |
| 234 | 0.70 | 0.90 | 107.2 |
| 235 | 0.75 | 0.90 | 120.5 |
| 236 | 0.80 | 0.90 | 139.7 |
| 237 | 0.85 | 0.90 | 142.8 |
| 238 | 0.90 | 0.90 | 150.6 |
| 239 | 0.95 | 0.90 | 154.3 |
| 240 | 1.00 | 0.90 | 158.2 |
| 242 | 0.25 | 0.95 | 104.1 |
| 243 | 0.30 | 0.95 | 101.9 |
| 244 | 0.35 | 0.95 | 105.0 |
| 245 | 0.40 | 0.95 | 108.1 |
| 246 | 0.45 | 0.95 | 106.9 |
| 247 | 0.50 | 0.95 | 105.7 |
| 204 | 0.55 | 0.95 | 107.9 |
| 248 | 0.60 | 0.95 | 126.7 |
| 249 | 0.65 | 0.95 | 118.7 |
| 250 | 0.70 | 0.95 | 110.7 |
| 251 | 0.75 | 0.95 | 120.3 |
| 252 | 0.80 | 0.95 | 140.6 |
| 253 | 0.85 | 0.95 | 151.7 |
| 254 | 0.90 | 0.95 | 149.6 |
| 255 | 0.95 | 0.95 | 155.3 |
| 256 | 1.00 | 0.95 | 154.3 |

TABLE 17

| Sample No. | x | y | $d_{33}$* (pm/V) |
|---|---|---|---|
| 258 | 0.25 | 1.00 | 103.3 |
| 259 | 0.30 | 1.00 | 105.1 |
| 260 | 0.35 | 1.00 | 108.2 |
| 261 | 0.40 | 1.00 | 106.8 |
| 262 | 0.45 | 1.00 | 102.9 |
| 263 | 0.50 | 1.00 | 102.3 |
| 264 | 0.55 | 1.00 | 107.9 |
| 265 | 0.60 | 1.00 | 110.5 |
| 266 | 0.65 | 1.00 | 111.3 |
| 267 | 0.70 | 1.00 | 106.7 |
| 268 | 0.75 | 1.00 | 121.7 |
| 269 | 0.80 | 1.00 | 143.4 |
| 270 | 0.85 | 1.00 | 149.6 |
| 271 | 0.90 | 1.00 | 150.4 |
| 272 | 0.95 | 1.00 | 155.2 |
| 273 | 1.00 | 1.00 | 156.1 |
| 275 | 0.25 | 1.05 | 109.4 |
| 276 | 0.30 | 1.05 | 106.4 |
| 277 | 0.35 | 1.05 | 119.7 |
| 278 | 0.40 | 1.05 | 104.6 |
| 279 | 0.45 | 1.05 | 101.5 |
| 280 | 0.50 | 1.05 | 117.2 |
| 281 | 0.55 | 1.05 | 110.0 |
| 282 | 0.60 | 1.05 | 105.1 |
| 283 | 0.65 | 1.05 | 116.7 |
| 284 | 0.70 | 1.05 | 109.1 |
| 285 | 0.75 | 1.05 | 126.0 |
| 286 | 0.80 | 1.05 | 140.9 |
| 287 | 0.85 | 1.05 | 141.5 |
| 288 | 0.90 | 1.05 | 150.2 |
| 289 | 0.95 | 1.05 | 148.3 |
| 290 | 1.00 | 1.05 | 156.8 |

From Tables 16 and 17, it is determined that the piezoelectric constant $d_{33}$* ranges from 100.5 to 158.2 pm/V, which are rarely different from 124.0 pm/V for the sample No. 201 (containing no BaSnO$_3$). This is because the spontaneous polarization Ps is a large value of 10 μC/cm$^2$ or more.

In particular, it is determined that in the case of the samples in which the range of x is 0.80≤x≤1.00 (sample Nos. 236 to 240, etc.), the piezoelectric constant $d_{33}$* ranges from 139.7 to 158.2 pm/V, which are extremely large numerical values as compared with 124.0 pm/V of the sample No. 201 (containing no BaSnO$_3$).

Table 18 shows: the leakage current in an electric field of 200 kV/cm; the dielectric constant ∈ and tan δ at a frequency of 1 kHz; and the values of spontaneous polarization $P_s$ and piezoelectric constant $d_{33}$* measured at a measuring frequency of 10 kHz and an applied electric field of 500 kV/cm in the case of 0.97 (K$_{0.1}$Na$_{0.9}$)Nb$_{0.95}$O$_3$-0.03M1SnO$_3$ (M1=Ca, Sr) with x=0.90, y=0.95, and n=0.03 (sample Nos. 308 and 309).

TABLE 18

| Sample No. | M1 | Leakage Current (A/cm$^2$) @200 kV/cm | ∈ @1 kHz | tanδ (%) @1 kHz | $P_s$ (μC/cm$^2$) | $d_{33}$* (pm/V) | G/NG Determination |
|---|---|---|---|---|---|---|---|
| 308 | Ca | 3.22 × 10$^{-6}$ | 846 | 2.22 | 20 | 151.4 | G |
| 309 | Sr | 4.19 × 10$^{-6}$ | 850 | 2.41 | 21 | 148.3 | G |

From Table 18, the sample with M1=Ca (sample No. 308) is 3.22×10$^{-6}$ A/cm$^2$ in leakage current, which is low. Furthermore, the spontaneous polarization $P_s$ is 20 μC/cm$^2$, and the ferroelectricity was thus also maintained. Accordingly, the sample with M1=Ca (Sample No. 308) was determined as a non-defective product (G).

In addition, the sample with M1=Sr (sample No. 309) is 4.19×10$^{-6}$ A/cm$^2$ in leakage current, which is also low. Furthermore, the spontaneous polarization $P_s$ is 21 μC/cm$^2$, and the ferroelectricity was thus also maintained. Accordingly, the sample with M1=Sr (Sample No. 309) was determined as a non-defective product (G).

Further, these samples with M1=Ca, Sr (sample Nos. 308 and 309) respectively have piezoelectric constants $d_{33}$* of 151.4 pm/V and 148.3 pm/V, and have improvements in piezoelectric constant $d_{33}$* observed as compared with the sample containing no M1SnO$_3$ (M1=Ca, Sr).

In the fourth embodiment, the evaluations were made on the samples containing 2 mol of Mn with respect to 100 mol of (K$_{1-x}$Na$_x$)Nb$_y$O$_3$. However, evaluation results similar to those in the fourth embodiment were achieved on samples containing 10 mol of Mn or less with respect to 100 mol of the main constituent 0.97(K$_{1-x}$Na$_x$)Nb$_y$O$_3$-0.03M1SnO$_3$ (M1=Ca, Sr, Ba).

Accordingly, from the evaluation results in this fourth embodiment, it has been revealed that piezoelectric thin film elements which have excellent leakage current characteristics, ferroelectric characteristics, and piezoelectric characteristics are achieved by meeting $0.25 \leq x \leq 1.00$ and $0.90 \leq y \leq 1.05$ in the potassium sodium niobate thin film represented by the general formula $(1-n)(K_{1-x}Na_x)Nb_yO_3$-$nM1SnO_3$ (M1=Ca, Sr, Ba) as the piezoelectric thin film 16.

Figure 4:
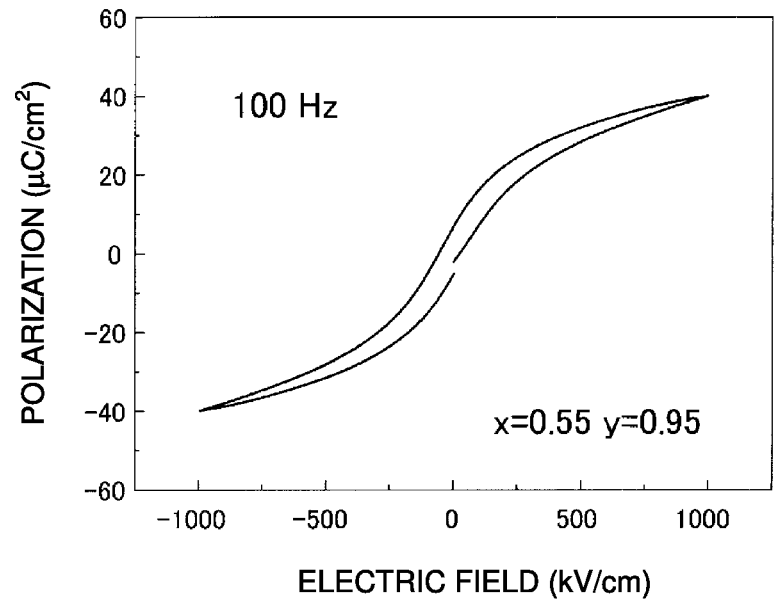
FIG. 4 is a graph showing a hysteresis curve for a piezoelectric thin film element with the use of a potassium sodium niobate thin film with BaSnO$_3$ as a solid solution.

FIG. 4 shows a ferroelectric hysteresis curve for the sample No. 204. It is determined that $BaSnO_3$ in the potassium sodium niobate as a solid solution improves the leakage current characteristics in electric fields of 100 kV/cm or more, and exhibits the favorable ferroelectric hysteresis curve even at the maximum applied voltage of 1 MV/cm and the measuring frequency of 100 Hz.

As just described, a piezoelectric thin film element which has excellent leakage current characteristics, ferroelectric characteristics, and piezoelectric characteristics is achieved by adjusting the ranges of x, y, and n respectively to $0.25 \leq x \leq 1.00$, $0.90 \leq y \leq 1.05$, and $0.01 \leq n \leq 0.10$ in the potassium sodium niobate thin film represented by the general formula for piezoelectric thin films: $(1-n)(K_{1-x}Na_x)Nb_yO_3$-$nM1SnO_3$ (M1=Ca, Sr, Ba) in the piezoelectric thin film element according to the present invention. Furthermore, the change in electrostatic capacitance with temperature is suppressed which is problematic in the use of ferroelectric thin film elements or piezoelectric thin film elements.

Manufacture of Piezoelectric Thin Film Element According to Fifth Embodiment

A piezoelectric thin film element according to a fifth embodiment is configured in the same fashion as the piezoelectric thin film element shown in FIG. 2 according to the first embodiment.

It is to be noted that the content of $BaHfO_3$ in a potassium sodium niobate thin film represented by the general formula $(1-n)(K_{1-x}Na_x)Nb_yO_3$-$nBaHfO_3$ as the piezoelectric thin film 16 is varied in the fifth embodiment.

The piezoelectric thin film 16, that is, potassium sodium niobate (KNN) thin film 16 is created by using a chemical solution deposition method.

First, potassium ethoxide, sodium ethoxide, pentaethoxy niobium, manganese acetylacetonato, barium ethoxide, and tetraisopropoxy hafnium as raw materials are prepared to meet $0.52 \times (1-n)$: $0.72 \times (1-n)$: $0.95 \times (1-n)$: $0.02 \times (1-n)$: n:n in terms of molar ratio. In the case of the present fifth embodiment herein, seven types of 0.00, 0.005, 0.01, 0.03, 0.05, 0.1, and 0.12 are selected as n.

Next, the potassium ethoxide, sodium ethoxide, pentaethoxy niobium, manganese acetylacetonato, barium ethoxide, and tetraisopropoxy hafnium as raw materials are mixed into a 2-methoxyethanol solvent in a glove box.

Next, the mixed solution is refluxed at 125° C. for 16 hours in a nitrogen atmosphere to provide a potassium sodium niobate (KNN) precursor solution (also referred to as a solution for chemical solution deposition) that has a concentration of 0.3 M.

On the other hand, the lower electrode 14 is formed on the Si substrate 12 by a magnetron DC sputtering method. Pt or the like is used as a material for the lower electrode 14.

The sputtering conditions include the sputtering output: 100 W; the sputtering time: 5 minutes; the temperature of the substrate 12: 300° C.; and the degree of vacuum: 5 millitorr.

Next, the potassium sodium niobate precursor solution is applied by spin coating onto the lower electrode 14 in a dry gas.

Next, a first heat treatment (preparatory heat treatment or drying treatment) is carried out. More specifically, the potassium sodium niobate precursor solution applied onto the lower electrode 14 is heated at a rate of temperature increase of 120° C./min with the use of a hot plate heated in advance to a temperature of 350° C., and dried at 350° C. for 3 minutes.

Next, a second heat treatment (main heat treatment or firing treatment) is carried out. More specifically, the dried potassium sodium niobate precursor film is heated up at a rate of temperature increase of 5° C./min or less in the temperature range of 350° C. to 750° C. (including temperatures around 500° C., which rapidly decompose complexes formed by reflux), and subjected to firing for 10 minutes at a temperature of 750° C. Thus, the potassium sodium niobate layer 16a is formed. The potassium sodium niobate layer 16a formed by the single process described previously is 30 nm in thickness.

Furthermore, the process for forming the potassium sodium niobate layer 16a is repeated 10 times to form a potassium sodium niobate thin film 16 that has a composition of $(1-n)(K_{0.45}Na_{0.55})Nb_{0.95}O_3$-$nBaHfO_3$ with a film thickness of 300 nm.

Next, the upper electrode 18 is formed by a magnetron DC sputtering method onto the potassium sodium niobate thin film 16. Pt or the like is used as a material for the upper electrode 18.

The sputtering conditions include the sputtering output: 100 W; the sputtering time: 5 minutes; the temperature of the substrate 12: 150° C.; and the degree of vacuum: 5 millitorr.

Thus, a piezoelectric thin film element is obtained.

It has been confirmed by composition analysis with Inductively Coupled Plasma (ICP) that the composition of the potassium sodium niobate thin film 16 is bang on target.

Evaluation of Piezoelectric Thin Film Element According to Fifth Embodiment

Table 19 shows electrical characteristics of the piezoelectric thin film element in the case of varying the proportion n of $BaHfO_3$ from 0.00 (sample No. 401), through 0.005 (sample No. 402), 0.01 (sample No. 403), 0.03 (sample No. 404), and 0.10 (sample No. 405), to 0.12 (sample No. 406). Items for the electrical characteristics are insulation properties, dielectric constant $\in$, tan δ, and ferroelectric characteristics.

TABLE 19

| Sample No. | n | Leakage Current (A/cm$^2$) @200 kV/cm | $\epsilon$ @1 kHz | tanδ (%) @1 kHz | $P_s$ (μC/cm$^2$) | G/NG Determination |
|---|---|---|---|---|---|---|
| 401* | 0 | $5.43 \times 10^{-4}$ | 726 | 2.12 | 28 | NG |
| 402* | 0.005 | $2.38 \times 10^{-4}$ | 821 | 2.21 | 26 | NG |
| 403 | 0.01 | $8.22 \times 10^{-6}$ | 956 | 2.30 | 24 | G |
| 404 | 0.03 | $6.15 \times 10^{-6}$ | 1122 | 2.39 | 21 | G |

TABLE 19-continued

| Sample No. | n | Leakage Current (A/cm$^2$) @200 kV/cm | $\epsilon$ @1 kHz | tan$\delta$ (%) @1 kHz | P$_s$ ($\mu$C/cm$^2$) | G/NG Determination |
|---|---|---|---|---|---|---|
| 405 | 0.1 | 3.61 × 10$^{-6}$ | 801 | 2.03 | 12 | G |
| 406* | 0.12 | 1.73 × 10$^{-6}$ | 509 | 1.88 | 8 | NG |

Mark *: outside the scope of the present invention

The sample No. 401 (n=0.00, containing no BaHfO$_3$) and the sample No. 402 (n=0.005) were determined as defective products (NG) because of the leakage currents of 5.43×10$^{-5}$ A/cm$^2$ or more. The sample No. 406 (n=0.12) was determined as a defective product (NG) because of the saturation polarization Ps less than 10 $\mu$C/cm$^2$. On the other hand, the sample No. 403 (n=0.01), sample No. 404 (n=0.03), and sample No. 405 (n=0.10) were determined as non-defective products (G) because of the leakage currents of 5.43×10$^{-5}$ A/cm$^2$ or less and the saturation polarization Ps of 10 $\mu$C/cm$^2$ or more.

More specifically, in the case of sample No. 402, the leakage current of 2.38×10$^{-4}$ A/cm$^2$ is rarely different from 5.43×10$^{-4}$ A/cm$^2$ as the leakage current of sample No. 401 (containing no BaHfO$_3$). However, the sample No. 403, the sample No. 404, the sample No. 405, and the sample No. 406, which are respectively 8.22×10$^{-6}$ A/cm$^2$, 6.15×10$^{-6}$ A/cm$^2$, 3.61×10$^{-6}$ A/cm$^2$, and 1.73×10$^{-6}$ A/cm$^2$ in leakage current, have achieved favorable leakage current characteristics.

Furthermore, the sample Nos. 401 to 406, which are respectively 28 $\mu$C/cm$^2$, 26 $\mu$C/cm$^2$, 24 $\mu$C/cm$^2$, 21 $\mu$C/cm$^2$, 12 $\mu$C/cm$^2$, and 8 $\mu$C/cm$^2$ in saturation polarization Ps, have a tendency to decrease the saturation polarization Ps as n is increased (in other words, the proportion of BaHfO$_3$ is increased). Further, the sample No. 406 (n=0.12) has substantially decreased saturation polarization Ps less than 10 $\mu$C/cm$^2$.

From the foregoing description, it is determined that the potassium sodium niobate thin film 16 with BaHfO$_3$ as a solid solution in the range of 0.01≤n≤0.10 with respect to (K$_{0.45}$Na$_{0.55}$)Nb$_{0.95}$O$_3$ can improve the leakage current characteristics while maintaining excellent ferroelectric characteristics.

Furthermore, the piezoelectric constants d$_{33}$* of the sample Nos. 401 to 406 were obtained in the same manner as in the first embodiment described previously. The measurement results are shown in Table 20.

TABLE 20

| Sample No. | n | d$_{33}$* (pm/V) |
|---|---|---|
| 401* | 0.00 | 124.0 |
| 402* | 0.005 | 120.6 |
| 403 | 0.01 | 123.7 |
| 404 | 0.03 | 128.7 |
| 405 | 0.10 | 111.9 |
| 406* | 0.12 | 89.2 |

Mark *outside the scope of the present invention

The piezoelectric constants d$_{33}$* of the sample Nos. 402 to 405 are respectively 120.6 pm/V, 123.7 pm/V, 128.7 pm/V, and 111.9 pm/V, which are values comparable to 124.0 pm/V of the sample No. 401 (containing no BaHfO$_3$). On the other hand, the sample No. 406 (n=0.12) has a drastically decreased piezoelectric constant d$_{33}$* of 89.2 pm/V. This is because the spontaneous polarization Ps is an extremely small value of 10 $\mu$C/cm$^2$ or less.

In the fifth embodiment, the evaluations were made on the samples containing 2 mol of Mn with respect to 100 mol of (K$_{0.45}$Na$_{0.55}$)Nb$_{0.95}$O$_3$. However, evaluation results similar to those in the fifth embodiment were achieved on samples containing 10 mol of Mn or less with respect to 100 mol of the main constituent (1−n)(K$_{0.45}$Na$_{0.55}$)Nb$_{0.95}$O$_3$-nBaHfO$_3$.

Manufacture of Piezoelectric Thin Film Element According to Sixth Embodiment

A piezoelectric thin film element according to a sixth embodiment is configured in the same fashion as the piezoelectric thin film element shown in FIG. 2 according to the first embodiment.

It is to be noted that the x and y in a potassium sodium niobate thin film represented by the general formula (1−n)(K$_{1-x}$Na$_x$)Nb$_y$O$_3$-nBaHfO$_3$ as the piezoelectric thin film 16 are varied in the sixth embodiment.

The piezoelectric thin film 16, that is, potassium sodium niobate (KNN) thin film 16 is created by using a chemical solution deposition method.

First, potassium ethoxide, sodium ethoxide, pentaethoxy niobium, manganese acetylacetonato, barium ethoxide, and tetraisopropoxy hafnium are prepared as raw materials are prepared to meet (1.07−x)×0.97:(x+0.17)×0.97: y×0.97:0.02×0.97:0.03: 0.03 in terms of molar ratio. In the case of the sixth embodiment herein, x and y respectively satisfy a conditional expression 0.2≤x≤1.00 and a conditional expression 0.85≤y≤1.10.

Thereafter, a piezoelectric thin film element including a substrate 12, a lower electrode 14 formed on the substrate 12, a piezoelectric thin film 16 formed on the lower electrode 14, and an upper electrode 18 formed on the piezoelectric thin film 16 is created by the same method as in the fifth embodiment.

The piezoelectric thin film 16 is a potassium sodium niobate (KNN) thin film that has a composition of 0.97(K$_{1-x}$Na$_x$)Nb$_y$O$_3$-0.03BaHfO$_3$ (0.2≤x≤1.00, 0.85≤y≤1.10) with a film thickness of 300 nm.

Evaluation of Piezoelectric Thin Film Element According to Sixth Embodiment

Tables 21, 22, and 23 show: the leakage current in an electric field of 200 kV/cm; the dielectric constant $\in$ and tan $\delta$ at a frequency of 1 kHz; and the value of saturation polarization Ps measured at a measuring frequency of 10 kHz and an applied electric field of 500 kV/cm, in the case of varying the x and y in 0.97 (K$_{1-x}$Na$_x$)Nb$_y$O$_3$-0.03BaHfO$_3$ in the ranges of 0.2≤x≤1.00 and 0.85≤y≤1.10 (sample No. 404, sample Nos. 407 to 507). It is to be noted that, in the same manner as in the fifth embodiment, in the case of the leakage current of 5.43×10$^{-5}$ A/cm$^2$ or less and the saturation polarization Ps of 10 $\mu$C/cm$^2$ or more, the sample was determined as a non-defective product (G), whereas the sample was determined as a defective product (NG) in all other cases.

TABLE 21

| Sample No. | x | y | Leakage Current (A/cm²) @200 kV/cm | $\epsilon$ @1 kHz | tanδ (%) @1 kHz | $P_s$ (μC/cm²) | G/NG Determination |
|---|---|---|---|---|---|---|---|
| 407* | 0.20 | 0.85 | $2.66 \times 10^{-2}$ | Unmeasurable | Unmeasurable | Unmeasurable | NG |
| 408* | 0.25 | 0.85 | $3.12 \times 10^{-2}$ | Unmeasurable | Unmeasurable | Unmeasurable | NG |
| 409* | 0.30 | 0.85 | $3.33 \times 10^{-2}$ | Unmeasurable | Unmeasurable | Unmeasurable | NG |
| 410* | 0.35 | 0.85 | $8.25 \times 10^{-2}$ | Unmeasurable | Unmeasurable | Unmeasurable | NG |
| 411* | 0.40 | 0.85 | $4.50 \times 10^{-2}$ | Unmeasurable | Unmeasurable | Unmeasurable | NG |
| 412* | 0.45 | 0.85 | $2.13 \times 10^{-2}$ | Unmeasurable | Unmeasurable | Unmeasurable | NG |
| 413* | 0.50 | 0.85 | $6.15 \times 10^{-2}$ | Unmeasurable | Unmeasurable | Unmeasurable | NG |
| 414* | 0.55 | 0.85 | $8.83 \times 10^{-2}$ | Unmeasurable | Unmeasurable | Unmeasurable | NG |
| 415* | 0.60 | 0.85 | $9.62 \times 10^{-2}$ | Unmeasurable | Unmeasurable | Unmeasurable | NG |
| 416* | 0.65 | 0.85 | $2.22 \times 10^{-1}$ | Unmeasurable | Unmeasurable | Unmeasurable | NG |
| 417* | 0.70 | 0.85 | $4.21 \times 10^{-1}$ | Unmeasurable | Unmeasurable | Unmeasurable | NG |
| 418* | 0.75 | 0.85 | $3.72 \times 10^{-1}$ | Unmeasurable | Unmeasurable | Unmeasurable | NG |
| 419* | 0.80 | 0.85 | $6.81 \times 10^{-1}$ | Unmeasurable | Unmeasurable | Unmeasurable | NG |
| 420* | 0.85 | 0.85 | $3.77 \times 10^{-1}$ | Unmeasurable | Unmeasurable | Unmeasurable | NG |
| 421* | 0.90 | 0.85 | $5.66 \times 10^{-2}$ | Unmeasurable | Unmeasurable | Unmeasurable | NG |
| 422* | 0.95 | 0.85 | $7.19 \times 10^{-2}$ | Unmeasurable | Unmeasurable | Unmeasurable | NG |
| 423* | 1.00 | 0.85 | $7.55 \times 10^{-2}$ | Unmeasurable | Unmeasurable | Unmeasurable | NG |
| 424* | 0.20 | 0.90 | $5.12 \times 10^{-4}$ | 1210 | 2.53 | 20 | NG |
| 425 | 0.25 | 0.90 | $6.81 \times 10^{-6}$ | 1322 | 2.41 | 19 | G |
| 426 | 0.30 | 0.90 | $7.77 \times 10^{-8}$ | 1199 | 2.33 | 21 | G |
| 427 | 0.35 | 0.90 | $8.29 \times 10^{-8}$ | 1123 | 2.69 | 23 | G |
| 428 | 0.40 | 0.90 | $2.39 \times 10^{-8}$ | 1241 | 2.61 | 22 | G |
| 429 | 0.45 | 0.90 | $9.17 \times 10^{-8}$ | 1231 | 2.23 | 18 | G |
| 430 | 0.50 | 0.90 | $5.54 \times 10^{-8}$ | 1106 | 2.53 | 19 | G |
| 431 | 0.55 | 0.90 | $6.15 \times 10^{-8}$ | 1064 | 2.92 | 21 | G |
| 432 | 0.60 | 0.90 | $7.68 \times 10^{-8}$ | 1023 | 2.83 | 22 | G |
| 433 | 0.65 | 0.90 | $2.22 \times 10^{-8}$ | 1004 | 2.66 | 22 | G |
| 434 | 0.70 | 0.90 | $3.84 \times 10^{-7}$ | 988 | 2.81 | 24 | G |
| 435 | 0.75 | 0.90 | $6.81 \times 10^{-7}$ | 946 | 2.46 | 25 | G |
| 436 | 0.80 | 0.90 | $5.69 \times 10^{-8}$ | 910 | 2.55 | 24 | G |
| 437 | 0.85 | 0.90 | $7.22 \times 10^{-8}$ | 930 | 2.38 | 25 | G |
| 438 | 0.90 | 0.90 | $4.57 \times 10^{-8}$ | 951 | 2.71 | 26 | G |
| 439 | 0.95 | 0.90 | $3.90 \times 10^{-8}$ | 941 | 2.66 | 24 | G |
| 440 | 1.00 | 0.90 | $8.86 \times 10^{-8}$ | 923 | 2.81 | 26 | G |

Mark *: outside the scope of the present invention

TABLE 22

| Sample No. | x | y | Leakage Current (A/cm²) @200 kV/cm | $\epsilon$ @1 kHz | tanδ (%) @1 kHz | $P_s$ (μC/cm²) | G/NG Determination |
|---|---|---|---|---|---|---|---|
| 441* | 0.20 | 0.95 | $6.89 \times 10^{-3}$ | 1223 | 2.65 | 20 | NG |
| 442 | 0.25 | 0.95 | $7.42 \times 10^{-6}$ | 1304 | 2.36 | 22 | G |
| 443 | 0.30 | 0.95 | $5.45 \times 10^{-7}$ | 1251 | 2.33 | 23 | G |
| 444 | 0.35 | 0.95 | $2.58 \times 10^{-7}$ | 1322 | 1.98 | 24 | G |
| 445 | 0.40 | 0.95 | $4.39 \times 10^{-7}$ | 1052 | 2.66 | 21 | G |
| 446 | 0.45 | 0.95 | $2.11 \times 10^{-7}$ | 1134 | 2.59 | 20 | G |
| 447 | 0.50 | 0.95 | $9.14 \times 10^{-7}$ | 1189 | 2.43 | 19 | G |
| 404 | 0.55 | 0.95 | $6.15 \times 10^{-6}$ | 1122 | 2.39 | 21 | G |
| 448 | 0.60 | 0.95 | $7.82 \times 10^{-7}$ | 1092 | 2.16 | 22 | G |
| 449 | 0.65 | 0.95 | $1.69 \times 10^{-7}$ | 1054 | 2.06 | 23 | G |
| 450 | 0.70 | 0.95 | $6.66 \times 10^{-7}$ | 1022 | 2.00 | 20 | G |
| 451 | 0.75 | 0.95 | $8.22 \times 10^{-7}$ | 1003 | 2.89 | 21 | G |
| 452 | 0.80 | 0.95 | $4.42 \times 10^{-7}$ | 992 | 2.34 | 22 | G |
| 453 | 0.85 | 0.95 | $5.88 \times 10^{-7}$ | 1043 | 2.55 | 22 | G |
| 454 | 0.90 | 0.95 | $7.44 \times 10^{-7}$ | 1060 | 2.46 | 23 | G |
| 455 | 0.95 | 0.95 | $8.23 \times 10^{-7}$ | 986 | 2.44 | 23 | G |
| 456 | 1.00 | 0.95 | $4.65 \times 10^{-7}$ | 1006 | 2.70 | 22 | G |
| 457* | 0.20 | 1.00 | $7.77 \times 10^{-4}$ | 1220 | 2.85 | 21 | NG |
| 458 | 0.25 | 1.00 | $8.16 \times 10^{-6}$ | 1122 | 2.39 | 22 | G |
| 459 | 0.30 | 1.00 | $9.52 \times 10^{-6}$ | 1055 | 2.38 | 20 | G |
| 460 | 0.35 | 1.00 | $4.57 \times 10^{-6}$ | 1035 | 2.26 | 23 | G |
| 461 | 0.40 | 1.00 | $2.64 \times 10^{-6}$ | 1122 | 2.39 | 25 | G |
| 462 | 0.45 | 1.00 | $7.22 \times 10^{-6}$ | 1183 | 2.20 | 20 | G |
| 463 | 0.50 | 1.00 | $4.61 \times 10^{-6}$ | 981 | 2.94 | 22 | G |
| 464 | 0.55 | 1.00 | $2.67 \times 10^{-6}$ | 974 | 2.38 | 21 | G |
| 465 | 0.60 | 1.00 | $9.71 \times 10^{-6}$ | 955 | 2.33 | 20 | G |
| 466 | 0.65 | 1.00 | $6.43 \times 10^{-6}$ | 923 | 2.51 | 23 | G |
| 467 | 0.70 | 1.00 | $7.11 \times 10^{-6}$ | 911 | 2.49 | 24 | G |
| 468 | 0.75 | 1.00 | $6.63 \times 10^{-6}$ | 924 | 2.82 | 25 | G |

TABLE 22-continued

| Sample No. | x | y | Leakage Current (A/cm$^2$) @200 kV/cm | $\epsilon$ @1 kHz | tanδ (%) @1 kHz | P$_s$ (μC/cm$^2$) | G/NG Determination |
|---|---|---|---|---|---|---|---|
| 469 | 0.80 | 1.00 | 7.15 × 10$^{-6}$ | 882 | 2.46 | 20 | G |
| 470 | 0.85 | 1.00 | 4.56 × 10$^{-6}$ | 906 | 2.55 | 23 | G |
| 471 | 0.90 | 1.00 | 5.71 × 10$^{-6}$ | 922 | 2.68 | 22 | G |
| 472 | 0.95 | 1.00 | 5.69 × 10$^{-6}$ | 931 | 2.66 | 25 | G |
| 473 | 1.00 | 1.00 | 7.55 × 10$^{-6}$ | 916 | 2.13 | 25 | G |

Mark *: outside the scope of the present invention

TABLE 23

| Sample No. | x | y | Leakage Current (A/cm$^2$) @200 kV/cm | $\epsilon$ @1 kHz | tanδ (%) @1 kHz | P$_s$ (μC/cm$^2$) | G/NG Determination |
|---|---|---|---|---|---|---|---|
| 474* | 0.20 | 1.05 | 4.12 × 10$^{-4}$ | 1188 | 2.93 | 18 | NG |
| 475 | 0.25 | 1.05 | 8.22 × 10$^{-6}$ | 1125 | 2.88 | 22 | G |
| 476 | 0.30 | 1.05 | 3.15 × 10$^{-6}$ | 1100 | 2.36 | 23 | G |
| 477 | 0.35 | 1.05 | 2.35 × 10$^{-6}$ | 1153 | 2.31 | 24 | G |
| 478 | 0.40 | 1.05 | 6.61 × 10$^{-6}$ | 1082 | 2.59 | 21 | G |
| 479 | 0.45 | 1.05 | 2.94 × 10$^{-6}$ | 1023 | 2.36 | 22 | G |
| 480 | 0.50 | 1.05 | 1.26 × 10$^{-6}$ | 1041 | 2.62 | 22 | G |
| 481 | 0.55 | 1.05 | 3.14 × 10$^{-6}$ | 973 | 2.06 | 23 | G |
| 482 | 0.60 | 1.05 | 4.11 × 10$^{-6}$ | 945 | 2.46 | 24 | G |
| 483 | 0.65 | 1.05 | 2.48 × 10$^{-6}$ | 935 | 2.73 | 23 | G |
| 484 | 0.70 | 1.05 | 6.71 × 10$^{-6}$ | 922 | 2.92 | 22 | G |
| 485 | 0.75 | 1.05 | 6.44 × 10$^{-6}$ | 842 | 2.16 | 20 | G |
| 486 | 0.80 | 1.05 | 5.68 × 10$^{-6}$ | 813 | 2.09 | 18 | G |
| 487 | 0.85 | 1.05 | 4.12 × 10$^{-6}$ | 855 | 2.46 | 22 | G |
| 488 | 0.90 | 1.05 | 5.68 × 10$^{-6}$ | 869 | 2.62 | 24 | G |
| 489 | 0.95 | 1.05 | 5.22 × 10$^{-6}$ | 902 | 2.88 | 23 | G |
| 490 | 1.00 | 1.05 | 7.66 × 10$^{-6}$ | 916 | 2.20 | 24 | G |
| 491* | 0.20 | 1.10 | 4.12 × 10$^{-3}$ | 1083 | 2.88 | Unmeasurable | NG |
| 492* | 0.25 | 1.10 | 4.91 × 10$^{-3}$ | 1034 | 3.00 | Unmeasurable | NG |
| 493* | 0.30 | 1.10 | 5.14 × 10$^{-3}$ | 1055 | 2.97 | Unmeasurable | NG |
| 494* | 0.35 | 1.10 | 6.41 × 10$^{-3}$ | 1003 | 2.99 | Unmeasurable | NG |
| 495* | 0.40 | 1.10 | 5.51 × 10$^{-3}$ | 968 | 2.84 | Unmeasurable | NG |
| 496* | 0.45 | 1.10 | 5.38 × 10$^{-3}$ | 923 | 2.79 | Unmeasurable | NG |
| 497* | 0.50 | 1.10 | 7.12 × 10$^{-3}$ | 982 | 2.91 | Unmeasurable | NG |
| 498* | 0.55 | 1.10 | 8.99 × 10$^{-3}$ | 936 | 2.69 | Unmeasurable | NG |
| 499* | 0.60 | 1.10 | 1.53 × 10$^{-3}$ | 913 | 2.55 | Unmeasurable | NG |
| 500* | 0.65 | 1.10 | 4.33 × 10$^{-3}$ | 900 | 2.83 | Unmeasurable | NG |
| 501* | 0.70 | 1.10 | 7.14 × 10$^{-3}$ | 866 | 2.49 | Unmeasurable | NG |
| 502* | 0.75 | 1.10 | 6.61 × 10$^{-3}$ | 923 | 2.69 | Unmeasurable | NG |
| 503* | 0.80 | 1.10 | 3.42 × 10$^{-3}$ | 824 | 2.85 | Unmeasurable | NG |
| 504* | 0.85 | 1.10 | 4.31 × 10$^{-3}$ | 906 | 2.99 | Unmeasurable | NG |
| 505* | 0.90 | 1.10 | 7.03 × 10$^{-3}$ | 911 | 2.76 | Unmeasurable | NG |
| 506* | 0.95 | 1.10 | 5.61 × 10$^{-3}$ | 929 | 2.66 | Unmeasurable | NG |
| 507* | 1.00 | 1.10 | 3.46 × 10$^{-3}$ | 859 | 2.46 | Unmeasurable | NG |

Mark *: outside the scope of the present invention

The sample Nos. 407 to 423 in Table 21 refer to samples in the case of varying x in the range of 0.20≤x≤1.00 with y=0.85. These samples are high in leakage current from 2.13×10$^{-2}$ A/cm$^2$ to 6.81×10$^{-1}$ A/cm$^2$, from which the effect of BaHfO$_3$ in a solid solution is not observed. Accordingly, the sample Nos. 407 to 423 were determined as defective products (NG). This is because the molar ratio between (K$_{1-x}$, Na$_x$, Ba) at the site A and (Nb$_y$, Hf) at the site B significantly deviates from the stoichiometric composition.

The sample Nos. 424 to 440 refer to samples in the case of varying x in the range of 0.20≤x≤1.00 with y=0.90. Among the samples, the leakage current of the sample with x=0.20 (sample No. 424) is 5.12×10$^{-4}$ A/cm$^2$. The sample was determined as a defective product (NG) because the value was little different from that of the sample No. 401 containing no BaHfO$_3$.

On the other hand, the leakage currents of the samples with 0.25≤x≤1.00 (the sample Nos. 425 to 440) range from 2.22×10$^{-8}$ A/cm$^2$ to 6.81×10$^{-6}$ A/cm$^2$. These values show significant improvements in leakage current as compared with the sample No. 401 containing no BaHfO$_3$. Furthermore, the saturation polarization Ps ranges from 18 to 26 μC/cm$^2$, and the ferroelectric characteristics were thus also maintained. Accordingly, the samples with 0.25≤x≤1.00 (the sample Nos. 425 to 440) were determined as non-defective products (G).

The sample No. 404 and Nos. 441 to 456 in Table 22 refer to samples in the case of varying x in the range of 0.20≤x≤1.00 with y=0.95. Among the samples, the leakage current of the sample with x=0.20 (sample No. 441) is 6.89×10$^{-3}$ A/cm$^2$. The sample was determined as a defective product (NG) because the value was worse than that of the sample No. 401 containing no BaHfO$_3$.

On the other hand, the leakage currents of the samples with $0.25 \leq x \leq 1.00$ (the sample No. 404 and sample Nos. 442 to 456) range from $1.69 \times 10^{-7}$ A/cm² to $7.42 \times 10^{-6}$ A/cm². These values show significant improvements in leakage current as compared with the sample No. 401 containing no BaHfO₃. Furthermore, the saturation polarization Ps ranges from 19 to 24 μC/cm², and the ferroelectric characteristics were thus also maintained. Accordingly, the samples with $0.25 \leq x \leq 1.00$ (the sample No. 404 and sample Nos. 442 to 456) were determined as non-defective products (G).

The sample Nos. 457 to 473 refer to samples in the case of varying x in the range of $0.20 \leq x \leq 1.00$ with y=1.00. Among the samples, the leakage current of the sample with x=0.20 (sample No. 457) is $7.77 \times 10^{-4}$ A/cm². The sample was determined as a defective product (NG) because the value was worse than that of the sample No. 401 containing no BaHfO₃.

On the other hand, the leakage currents of the samples with $0.25 \leq x \leq 1.00$ (the sample Nos. 458 to 473) range from $2.64 \times 10^{-6}$ A/cm² to $9.71 \times 10^{-6}$ A/cm². These values show significant improvements in leakage current as compared with the sample No. 401 containing no BaHfO₃. Furthermore, the saturation polarization Ps ranges from 20 to 25 μC/cm², and the ferroelectric characteristics were thus also maintained. Accordingly, the samples with $0.25 \leq x \leq 1.00$ (the sample Nos. 458 to 473) were determined as non-defective products (G).

The sample Nos. 474 to 490 in Table 23 refer to samples in the case of varying x in the range of $0.20 \leq x \leq 1.00$ with y=1.05. Among the samples, the leakage current of the sample with x=0.20 (sample No. 474) is $4.12 \times 10^{-4}$ A/cm². The sample was determined as a defective product (NG) because the value was worse than that of the sample No. 401 containing no BaHfO₃.

On the other hand, the leakage currents of the samples with $0.25 \leq x \leq 1.00$ (the sample Nos. 475 to 490) range from $1.26 \times 10^{-6}$ A/cm² to $8.22 \times 10^{-6}$ A/cm². These values show significant improvements in leakage current as compared with the sample No. 401 containing no BaHfO₃. Furthermore, the saturation polarization Ps ranges from 20 to 24 μC/cm², and the ferroelectric characteristics were thus also maintained. Accordingly, the samples with $0.25 \leq x \leq 1.00$ (the sample Nos. 475 to 490) were determined as non-defective products (G).

The sample Nos. 491 to 507 refer to samples in the case of varying x in the range of $0.20 \leq x \leq 1.00$ with y=1.10. These samples are high in leakage current from $1.53 \times 10^{-3}$ A/cm² to $8.99 \times 10^{-3}$ A/cm², from which the effect of BaHfO₃ in a solid solution is not observed. Accordingly, the sample Nos. 491 to 507 were determined as defective products (NG). This is because the molar ratio between $(K_{1-x}, Na_x, Ba)$ at the site A and $(Nb_y, Hf)$ at the site B significantly deviates from the stoichiometric composition.

In addition, the samples determined as non-defective products (G) are all 3% or less in tan δ, which is extremely low. Therefore, it is determined that high-quality potassium sodium niobate thin films 16 are created.

Furthermore, the piezoelectric constant $d_{33}^*$ was figured out in the same way as in the second embodiment described previously, for the samples determined as non-defective products (G) in the non-defective/defective (G/NG) determination described above (sample No. 404, sample Nos. 425 to 440, etc.). The measurement results are shown in Tables 24 and 25.

TABLE 24

| Sample No. | x | y | $d_{33}^*$ (pm/V) |
|---|---|---|---|
| 425 | 0.25 | 0.90 | 118.2 |
| 426 | 0.30 | 0.90 | 113.1 |
| 427 | 0.35 | 0.90 | 115.6 |
| 428 | 0.40 | 0.90 | 120.6 |
| 429 | 0.45 | 0.90 | 122.4 |
| 430 | 0.50 | 0.90 | 123.9 |
| 431 | 0.55 | 0.90 | 132.1 |
| 432 | 0.60 | 0.90 | 108.9 |
| 433 | 0.65 | 0.90 | 122.9 |
| 434 | 0.70 | 0.90 | 124.0 |
| 435 | 0.75 | 0.90 | 119.8 |
| 436 | 0.80 | 0.90 | 140.3 |
| 437 | 0.85 | 0.90 | 150.2 |
| 438 | 0.90 | 0.90 | 147.6 |
| 439 | 0.95 | 0.90 | 155.3 |
| 440 | 1.00 | 0.90 | 158.2 |
| 442 | 0.25 | 0.95 | 115.2 |
| 443 | 0.30 | 0.95 | 116.0 |
| 444 | 0.35 | 0.95 | 114.3 |
| 445 | 0.40 | 0.95 | 115.0 |
| 446 | 0.45 | 0.95 | 119.3 |
| 447 | 0.50 | 0.95 | 116.8 |
| 404 | 0.55 | 0.95 | 128.7 |
| 448 | 0.60 | 0.95 | 117.5 |
| 449 | 0.65 | 0.95 | 118.6 |
| 450 | 0.70 | 0.95 | 120.3 |
| 451 | 0.75 | 0.95 | 129.5 |
| 452 | 0.80 | 0.95 | 141.2 |
| 453 | 0.85 | 0.95 | 145.5 |
| 454 | 0.90 | 0.95 | 150.6 |
| 455 | 0.95 | 0.95 | 155.9 |
| 456 | 1.00 | 0.95 | 158.6 |

TABLE 25

| Sample No. | x | y | $d_{33}^*$ (pm/V) |
|---|---|---|---|
| 458 | 0.25 | 1.00 | 120.6 |
| 459 | 0.30 | 1.00 | 121.1 |
| 460 | 0.35 | 1.00 | 129.8 |
| 461 | 0.40 | 1.00 | 135.2 |
| 462 | 0.45 | 1.00 | 130.8 |
| 463 | 0.50 | 1.00 | 119.8 |
| 464 | 0.55 | 1.00 | 111.6 |
| 465 | 0.60 | 1.00 | 120.5 |
| 466 | 0.65 | 1.00 | 128.3 |
| 467 | 0.70 | 1.00 | 127.3 |
| 468 | 0.75 | 1.00 | 122.1 |
| 469 | 0.80 | 1.00 | 142.2 |
| 470 | 0.85 | 1.00 | 143.6 |
| 471 | 0.90 | 1.00 | 140.5 |
| 472 | 0.95 | 1.00 | 150.6 |
| 473 | 1.00 | 1.00 | 155.7 |
| 475 | 0.25 | 1.05 | 129.0 |
| 476 | 0.30 | 1.05 | 128.2 |
| 477 | 0.35 | 1.05 | 130.9 |
| 478 | 0.40 | 1.05 | 120.1 |
| 479 | 0.45 | 1.05 | 109.3 |
| 480 | 0.50 | 1.05 | 102.3 |
| 481 | 0.55 | 1.05 | 117.8 |
| 482 | 0.60 | 1.05 | 129.5 |
| 483 | 0.65 | 1.05 | 125.5 |
| 484 | 0.70 | 1.05 | 124.0 |
| 485 | 0.75 | 1.05 | 130.8 |
| 486 | 0.80 | 1.05 | 142.6 |
| 487 | 0.85 | 1.05 | 150.7 |
| 488 | 0.90 | 1.05 | 152.3 |
| 489 | 0.95 | 1.05 | 154.9 |
| 490 | 1.00 | 1.05 | 158.0 |

From Tables 24 and 25, it is determined that the piezoelectric constant $d_{33}^*$ ranges from 102.3 to 158.6 pm/V, which are rarely different from 124.0 pm/V for the sample No. 401 (containing no $BaHfO_3$). This is because the spontaneous polarization Ps is a large value of 10 $\mu C/cm^2$ or more.

In particular, it is determined that in the case of the samples in which the range of x is 0.80≤x≤1.00 (sample Nos. 436 to 440, etc.), the piezoelectric constant $d_{33}*$ ranges from 140.3 to 158.6 pm/V, which are extremely large numerical values as compared with 124.0 pm/V of the sample No. 401 (containing no $BaHfO_3$).

Table 26 shows: the leakage current in an electric field of 200 kV/cm; the dielectric constant $\in$ and tan δ at a frequency of 1 kHz; and the values of spontaneous polarization $P_s$ and piezoelectric constant $d_{33}*$ measured at a measuring frequency of 10 kHz and an applied electric field of 500 kV/cm in the case of 0.97 $(K_{0.1}Na_{0.9})Nb_{0.95}O_3$-$0.03M1HfO_3$ (M1=Ca, Sr) with x=0.90, y=0.95, and n=0.03 (sample Nos. 508 and 509).

TABLE 26

| Sample No. | M1 | Leakage Current $(A/cm^2)$ @200 kV/cm | $\epsilon$ @1 kHz | tanδ (%) @1 kHz | $P_s$ $(\mu C/cm^2)$ | $d_{33}*$ (pm/V) | G/NG Determination |
|---|---|---|---|---|---|---|---|
| 508 | Ca | $2.13 \times 10^{-6}$ | 943 | 2.34 | 22 | 153.4 | G |
| 509 | Sr | $5.96 \times 10^{-6}$ | 971 | 2.50 | 22 | 150.4 | G |

From Table 26, the sample with M1=Ca (sample No. 508) is $2.13 \times 10^{-6}$ $A/cm^2$ in leakage current, which is low. Furthermore, the spontaneous polarization $P_s$ is 22 $\mu C/cm^2$, and the ferroelectricity was thus also maintained. Accordingly, the sample with M1=Ca (Sample No. 508) was determined as a non-defective product (G).

In addition, the sample with M1=Sr (sample No. 509) is $5.96 \times 10^{-6}$ $A/cm^2$ in leakage current, which is also low. Furthermore, the spontaneous polarization $P_s$ is 22 $\mu C/cm^2$, and the ferroelectricity was thus also maintained. Accordingly, the sample with M1=Sr (Sample No. 509) was determined as a non-defective product (G).

Further, these samples with M1=Ca, Sr (sample Nos. 508 and 509) respectively have piezoelectric constants $d_{33}*$ of 153.4 pm/V and 150.4 pm/V, and have improvements in piezoelectric constant $d_{33}*$ observed as compared with the sample containing no $M1HfO_3$ (M1=Ca, Sr).

In the sixth embodiment, the evaluations were made on the samples containing 2 mol of Mn with respect to 100 mol of $(K_{1-x}Na_x)Nb_yO_3$. However, evaluation results similar to those in the sixth embodiment were achieved on samples containing 10 mol of Mn or less with respect to 100 mol of the main constituent $0.97(K_{1-x}Na_x)Nb_yO_3$-$0.03M1HfO_3$ (M1=Ca, Sr, Ba).

Accordingly, from the evaluation results in this sixth embodiment, it has been revealed that piezoelectric thin film elements which have excellent leakage current characteristics, ferroelectric characteristics, and piezoelectric characteristics are achieved by meeting 0.25≤x≤1.00 and 0.90≤y≤1.05 in the potassium sodium niobate thin film represented by the general formula $(1-n)(K_{1-x}Na_x)Nb_yO_3$-$nM1HfO_3$ (M1=Ca, Sr, Ba) as the piezoelectric thin film 16.

Figure 5:
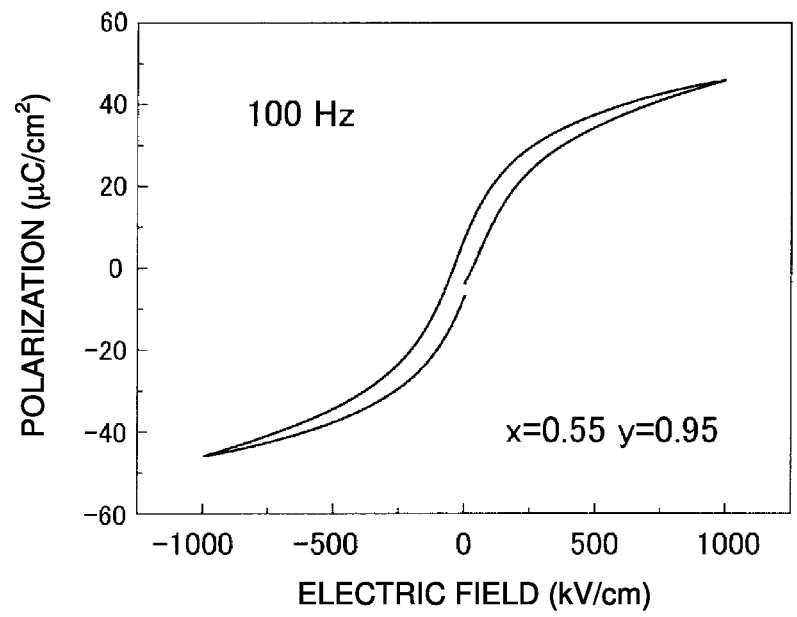
FIG. 5 is a graph showing a hysteresis curve for a piezoelectric thin film element with the use of a potassium sodium niobate thin film with BaHfO$_3$ as a solid solution.

FIG. 5 shows a ferroelectric hysteresis curve for the sample No. 404. It is determined that $BaHfO_3$ in the potassium sodium niobate as a solid solution improves the leakage current characteristics in electric fields of 100 kV/cm or more, and exhibits the favorable ferroelectric hysteresis curve even at the maximum applied voltage of 1 MV/cm and the measuring frequency of 100 Hz.

As just described, a piezoelectric thin film element which has excellent leakage current characteristics, ferroelectric characteristics, and piezoelectric characteristics is achieved by adjusting the ranges of x, y, and n respectively to 0.25≤x≤1.00, 0.90≤y≤1.05, and 0.01≤n≤0.10 in the potassium sodium niobate thin film represented by the general formula for piezoelectric thin films: $(1-n)(K_{1-x}Na_x)Nb_yO_3$-$nM1HfO_3$ (M1=Ca, Sr, Ba) in the piezoelectric thin film element according to the present invention. Furthermore, the change in electrostatic capacitance with temperature is suppressed which is problematic in the use of ferroelectric thin film elements or piezoelectric thin film elements.

It is to be noted that this invention is not to be considered limited to the embodiments described previously, and various modifications are made within the scope of the invention. Although the potassium sodium niobate thin film 16 is created by a chemical solution deposition method, for example, a sputtering method, an aerosol deposition method, a pulsed laser deposition method, or the like may be used for the creation as long as the composition of the created potassium sodium niobate thin film 16 falls within the scope of the present invention.

The invention claimed is:

1. A piezoelectric thin film element comprising:
an electrode; and
a piezoelectric film adjacent the electrode,
wherein the piezoelectric film is a potassium sodium niobate film containing the general formula $(1-n)(K_{1-x}Na_x)Nb_yO_3$-$nBaZrO_3$ as its main constituent, and x, y, and n respectively are within the ranges of: 0.25≤x≤0.75; 0.85≤y≤1.10; and 0.01≤n≤0.10.

2. The piezoelectric thin film element according to claim 1, further comprising a substrate adjacent the electrode.

3. The piezoelectric thin film element according to claim 2, wherein the substrate is one of a silicon substrate, a glass substrate, a quartz glass substrate, a GaAs substrate, a GaN substrate, a $CaF_2$ substrate, a sapphire substrate, an MgO substrate, an $SrTiO_3$ substrate, an $LaAlO_3$ substrate, and a stainless-steel substrate.

4. The piezoelectric thin film element according to claim 1, wherein the piezoelectric film has a thickness of 300 nm.

5. A piezoelectric thin film element comprising:
an electrode; and
a piezoelectric film adjacent the electrode,
wherein the piezoelectric film is a potassium sodium niobate film containing the general formula $(1-n)(K_{1-x}Na_x)Nb_yO_3$-$nBaSnO_3$ as its main constituent, and x, y, and n respectively are within the ranges of: 0.25≤x≤0.75; 0.90≤y≤1.05; and 0.01≤n≤0.10.

6. The piezoelectric thin film element according to claim 5, further comprising a substrate adjacent the electrode.

7. The piezoelectric thin film element according to claim 6, wherein the substrate is one of a silicon substrate, a glass substrate, a quartz glass substrate, a GaAs substrate, a GaN substrate, a CaF$_2$ substrate, a sapphire substrate, an MgO substrate, an SrTiO$_3$ substrate, an LaAlO$_3$ substrate, and a stainless-steel substrate.

8. The piezoelectric thin film element according to claim 5, wherein the piezoelectric film has a thickness of 300 nm.

9. A piezoelectric thin film element comprising:
an electrode; and
a piezoelectric film adjacent the electrode,
wherein the piezoelectric film is a potassium sodium niobate film represented, as its main constituent, by the general formula (1−n)(K$_{1-x}$Na$_x$) Nb$_y$O$_3$-nM1M2O$_3$ in which M1 is any one of Ca, Sr, and Ba, M2 is Zr, and x, y, and n respectively are within the ranges of: 0.25≤x≤1.00; 0.85≤y≤1.10; and 0.01≤n≤0.10.

10. The piezoelectric thin film element according to claim 9, wherein x is within the range of 0.80≤x≤1.00.

11. The piezoelectric thin film element according to claim 9, further comprising a substrate adjacent the electrode.

12. The piezoelectric thin film element according to claim 11, wherein the substrate is one of a silicon substrate, a glass substrate, a quartz glass substrate, a GaAs substrate, a GaN substrate, a CaF$_2$ substrate, a sapphire substrate, an MgO substrate, an SrTiO$_3$ substrate, an LaAlO$_3$ substrate, and a stainless-steel substrate.

13. The piezoelectric thin film element according to claim 9, wherein the piezoelectric film has a thickness of 300 nm.

14. A piezoelectric thin film element comprising:
an electrode; and
a piezoelectric film adjacent the electrode,
wherein the piezoelectric film is a potassium sodium niobate film represented, as its main constituent, by the general formula (1−n)(K$_{1-x}$Na$_x$) Nb$_y$O$_3$-nM1M2O$_3$ in which M1 is any one of Ca, Sr, and Ba, M2 is any one of Sn and Hf, and x, y, and n respectively are within the ranges of: 0.25≤x≤1.00; 0.90≤y≤1.05; and 0.01≤n≤0.10.

15. The piezoelectric thin film element according to claim 14, wherein x is within the range of 0.80≤x≤1.00.

16. The piezoelectric thin film element according to claim 14, further comprising a substrate adjacent the electrode.

17. The piezoelectric thin film element according to claim 16, wherein the substrate is one of a silicon substrate, a glass substrate, a quartz glass substrate, a GaAs substrate, a GaN substrate, a CaF$_2$ substrate, a sapphire substrate, an MgO substrate, an SrTiO$_3$ substrate, an LaAlO$_3$ substrate, and a stainless-steel substrate.

18. The piezoelectric thin film element according to claim 14, wherein the piezoelectric film has a thickness of 300 nm.

* * * * *